United States Patent
Chaivipas

(10) Patent No.: US 9,331,705 B2
(45) Date of Patent: May 3, 2016

(54) TIMING ADJUSTMENT CIRCUIT, CLOCK GENERATION CIRCUIT, AND METHOD FOR TIMING ADJUSTMENT

(71) Applicant: FUJITSU LIMITED, Kawasaki-shi, Kanagawa (JP)

(72) Inventor: Win Chaivipas, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/591,156

(22) Filed: Jan. 7, 2015

(65) Prior Publication Data
US 2015/0200674 A1 Jul. 16, 2015

(30) Foreign Application Priority Data
Jan. 16, 2014 (JP) .................................. 2014-006069

(51) Int. Cl.
H03L 7/06 (2006.01)
H03L 7/18 (2006.01)
H03L 7/081 (2006.01)

(52) U.S. Cl.
CPC ................ *H03L 7/18* (2013.01); *H03L 7/0814* (2013.01)

(58) Field of Classification Search
USPC .......... 327/105–123, 141, 144–163; 331/1/A, 331/15–17; 375/373–376
See application file for complete search history.

(56) References Cited

U.S. PATENT DOCUMENTS

| | | | |
|---|---|---|---|
| 6,859,081 B2* | 2/2005 | Hong et al. | 327/175 |
| 2001/0009385 A1 | 7/2001 | Lai et al. | |
| 2003/0218486 A1* | 11/2003 | Kwak | 327/158 |
| 2008/0042706 A1* | 2/2008 | Yang et al. | 327/158 |

FOREIGN PATENT DOCUMENTS

| | | |
|---|---|---|
| JP | 05-073167 | 3/1993 |
| JP | 2001-268062 | 9/2001 |
| JP | 2003-037496 | 2/2003 |

* cited by examiner

*Primary Examiner* — Brandon S Cole
(74) *Attorney, Agent, or Firm* — Fujitsu Patent Center

(57) ABSTRACT

A timing adjustment circuit includes a detection unit to generate a detection signal in response to a first clock having a duty cycle of 50% and a first frequency, a second clock having a duty cycle of 50% and a second frequency that is half the first frequency, and a third clock having a duty cycle of 50%, the second frequency, and a phase displacement of 90 degrees relative to the second clock, the detection signal indicating timing relationship between the first clock and the second and third clocks, a low-pass filter to receive the detection signal, and a variable-delay circuit to adjust relative timing relationship between the first clock and the second clock in response to an output of the low-pass filter such that a center point of a pulse of the first clock is aligned with a center point of a pulse of the second clock.

9 Claims, 18 Drawing Sheets

TIMING ADJUSTMENT CIRCUIT, CLOCK GENERATION CIRCUIT, AND METHOD FOR TIMING ADJUSTMENT

CROSS-REFERENCE TO RELATED APPLICATIONS

The present application is based upon and claims the benefit of priority from the prior Japanese Patent Application No. 2014-006069 filed on Jan. 16, 2014, with the Japanese Patent Office, the entire contents of which are incorporated herein by reference.

FIELD

The disclosures herein relate to a timing adjustment circuit, a clock generation circuit, and a method for timing adjustment.

BACKGROUND

In the case of a high-speed input signal being subjected to a comparison process or the like for sampling or for signal detection, it may be difficult to match the speed of the process with the speed of the signal. In such a case, a plurality of processing circuits arranged in parallel may be connected to a signal line, respectively, on which an input signal propagates. In this circuit configuration, the plurality of processing circuits process in a time-division multiplexing manner a plurality of respective signal values of the input signal successively arranged along the time axis. Such a configuration in which a plurality of processing circuits arranged in parallel are connected to a single signal line entails the presence of large combined input capacitance provided by these processing circuits as viewed from the direction of the single signal line, which ends up limiting the bandwidth.

In order to obviate the problem of bandwidth limitation, the input signal may be demultiplexed before being processed by the plurality of processing circuits. In order to demultiplex a signal, clock signals having different phases, different frequencies, and various duty ratios are utilized. For the purpose of achieving proper demultiplexing, the clock signals generated and supplied to a demultiplex circuit need to have proper phase relationships with each other through timing adjustment therebetween. Clock signals subjected to such timing adjustment include clock signals having different frequencies.

[Patent Document 1] Japanese Laid-open Patent Publication No. 2001-268062

[Patent Document 2] Japanese Laid-open Patent Publication No. 5-73167

[Patent Document 3] Japanese Laid-open Patent Publication No. 2003-37496

SUMMARY

According to an aspect of the embodiment, a timing adjustment circuit includes a detection unit configured to generate a detection signal in response to a first clock signal having both a duty cycle of 50% and a first frequency, a second clock signal having both a duty cycle of 50% and a second frequency that is half the first frequency, and a third clock signal having both a duty cycle of 50% and the second frequency and having a phase displacement of 90 degrees relative to the second clock signal, the detection signal being indicative of timing relationship between the first clock signal and the second and third clock signals, a low-pass filter configured to receive the detection signal generated by the detection unit, and a variable-delay circuit configured to adjust a relative timing relationship between the first clock signal and the second clock signal in response to an output of the low-pass filter such that a center point of a pulse of the first clock signal is aligned with a center point of a pulse of the second clock signal.

According to an aspect of the invention, a clock generation circuit includes a frequency divider circuit configured to divide a frequency of a first clock signal having both a duty cycle of 50% and a first frequency to generate a second clock signal having both a duty cycle of 50% and a second frequency that is half the first frequency, a third clock signal having both a duty cycle of 50% and the second frequency and having a phase displacement of 90 degrees relative to the second clock signal, and a fourth clock signal having both a duty cycle of 50% and a third frequency that is one fourth of the first frequency, a detection unit configured to generate a detection signal in response to the first clock signal, the second clock signal, and the third clock signal, the detection signal being indicative of a timing relationship between the first clock signal and the second and third clock signals, a low-pass filter configured to receive the detection signal generated by the detection unit, a variable-delay circuit configured to adjust a relative timing relationship between the first clock signal and the second clock signal in response to an output of the low-pass filter such that a center point of a pulse of the first clock signal is aligned with a center point of a pulse of the second clock signal, a variable-delay circuit configured to variably control a delay time with respect to the fourth clock signal in response to the output of the low-pass filter, and an AND gate configured to perform an AND operation between the first clock signal and the second clock signal to generate a fifth clock signal having both a duty cycle of 25% and the second frequency.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings.

Figure 1:
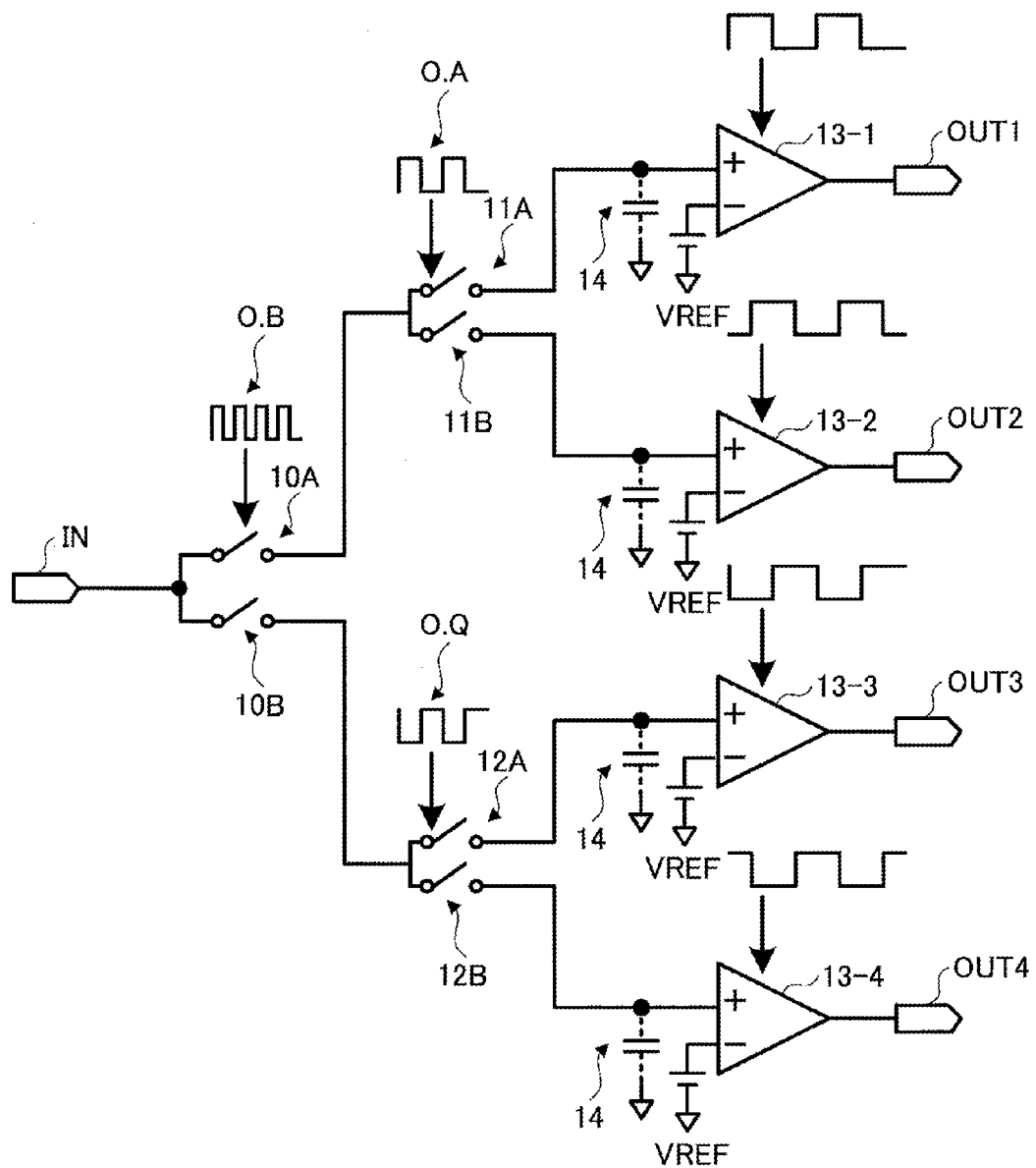
FIG. 1 is a drawing illustrating an example of the configuration of a parallel processing circuit.

FIG. 1 is a drawing illustrating an example of the configuration of a parallel processing circuit. The parallel processing circuit illustrated in FIG. 1 includes switch circuits 10A through 12A, switch circuits 10B through 12B, and comparison circuits 13-1 through 13-4. A multiplexed signal input into an input terminal IN is demultiplexed by the switch circuits 10A through 12A and the switch circuits 10B through 12B for provision to the non-inverted inputs of the comparison circuits 13-1 through 13-4. Each of the comparison circuits 13-1 through 13-4 compares the demultiplexed signal input into the non-inverted input thereof with a reference potential VREF applied to the inverted input thereof, thereby outputting the result of comparison to a corresponding one of the output terminals OUT1 through OUT4. Signal lines connected to the non-inverted inputs of the comparison circuits 13-1 through 13-4 have parasitic capacitance 14 associated therewith. If the switch circuits 10A through 12A and the switch circuits 10B through 12B were not provided for demultiplexing, and the input multiplexed signal was supplied to the comparison circuits 13-1 through 13-4 without any switching, large input capacitance would be in existence as viewed from the direction of the input terminal IN, which ended up limiting the bandwidth of the input multiplexed signal. Demultiplexing performed by the switch circuits 10A through 12A and the switch circuits 10B through 12B enables the realization of high-speed signal changes, thereby achieving parallel comparison processes with respect to a high-speed input multiplexed signal.

The switch circuit 10A continues to open and close in synchronization with a clock signal O_B having predetermined frequency $f_1$ and a duty cycle of 50%. The switch circuit 10B continues to open and close in synchronization with a clock signal that is the inverse of the clock signal O_B. Namely, one of the switch circuits 10A and 10B is open when the other is closed, and is closed when the other is open.

The switch circuit 11A continues to open and close in synchronization with a clock signal O_A having predetermined frequency $f_1/2$ (i.e., half of $f_1$) and a duty cycle of 50%. The switch circuit 11B continues to open and close in synchronization with a clock signal that is the inverse of the clock signal O_A. Namely, one of the switch circuits 11A and 11B is open when the other is closed, and is closed when the other is open.

The switch circuit 12A continues to open and close in synchronization with a clock signal O_Q that has predetermined frequency $f_1/2$, a duty cycle of 50%, and a 90-degree phase displacement relative to the clock signal O_A. The switch circuit 12B continues to open and close in synchronization with a clock signal that is the inverse of the clock signal O_Q. Namely, one of the switch circuits 12A and 12B is open when the other is closed, and is closed when the other is open.

When no other than the clock signal O_B having frequency $f_1$ among the plurality of clock signals described above is given, a frequency divider having this clock signal as an input thereof may be used to generate a plurality of clock signals each having frequency $f_1/2$. The clock signals generated by the frequency divider have a phase displacement relative to each other that may be a predetermined angle such as 90 degrees or 180 degrees. In this manner, the use of a frequency divider easily enables the generation of the clock signal O_A having frequency $f_1/2$ and the clock signal O_Q having frequency $f_1/2$ with a 90-degree displacement relative to each other, which means that the two of the clock signals supplied to the switch circuits 10A through 12A and the switch circuits 10B through 12B previously described are easily generated. However, the clock signals O_A and O_Q each having frequency $f_1/2$ that are output from the frequency divider have a phase displacement relative to the clock signal O_B having frequency $f_1$ that is input into the frequency divider such that the phase displacement varies depending on the circuit configuration of the frequency divider. Because of this, it is preferable to adjust the phase relationship between the clock signal having frequency $f_1$ and the clock signals having frequency $f_1/2$.

Figure 2:
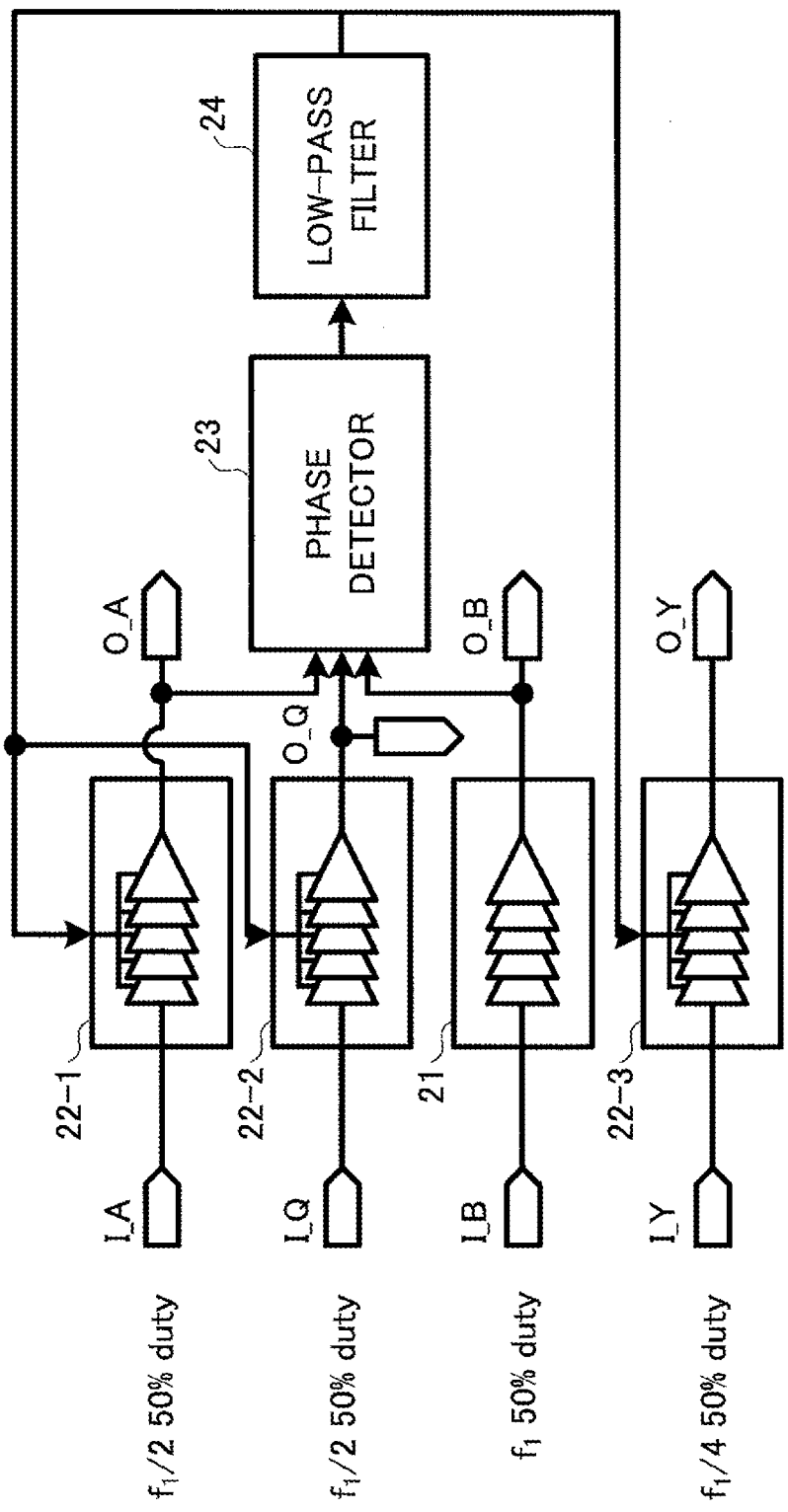
FIG. 2 is a drawing illustrating an example of the configuration of a circuit that adjusts timing between clock signals having different frequencies.

FIG. 2 is a drawing illustrating an example of the configuration of a circuit that adjusts timing between clock signals having different frequencies. The timing adjustment circuit illustrated in FIG. 2 includes a delay circuit 21, variable-delay circuits 22-1 through 22-3, a phase detector 23, and a low-pass filter 24. In FIG. 2 and the subsequent drawings, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

A clock signal I_B input into the delay circuit 21 is a pulse signal having predetermined frequency $f_1$ and a duty cycle of 50%. A clock signal I_A input into the variable-delay circuit 22-1 is a pulse signal having a duty cycle of 50% and predetermined frequency $f_1/2$, which is half of frequency $f_1$. A clock signal I_Q input into the variable-delay circuit 22-2 is a pulse signal that has a phase displacement of 90 degrees relative to the clock signal I_A, and that has frequency $f_1/2$ and a duty cycle of 50%. A clock signal I_Y input into the variable-delay circuit 22-3 is a pulse signal having predetermined frequency $f_1/4$ (i.e., a quarter of $f_1$) and a duty cycle of 50%.

The variable-delay circuits 22-1 through 22-3 delay the input clock signals I_A, I_Q, and I_Y to impose the same delay length, thereby generating output clock signals O_A, O_Q, and O_Y, respectively. The delay length of the variable-delay circuits 22-1 through 22-3 varies in response to the output of the low-pass filter 24. The delay circuit 21 delays the input clock signal I_B to impose a predetermined delay time, thereby generating the output clock signal O_B The delay length of the delay circuit 21 is fixed.

The clock signal O_B has frequency $f_1$ and a duty cycle of 50%. The clock signal O_A has a duty cycle of 50% and frequency $f_1/2$, which is half of frequency $f_1$. The clock signal O_Q has a duty cycle of 50% and frequency $f_1/2$, and has a phase displacement of 90 degrees relative to the clock signal O_A.

The phase detector 23 generates a detection signal indicative of the timing relationship between the clock signal O_B and the clock signals O_A and O_Q in response to the clock signal O_B, the clock signal O_A, and the clock signal O_Q. The low-pass filter 24 receives the detection signal generated by the phase detector 23, and cuts or attenuates the high frequency components of the detection signal to generate an output signal that corresponds to the low frequency components of the detection signal.

The variable-delay circuit 22-1 adjusts the relative timing relationship between the clock signal O_B and the clock signal O_A such that the center point of a pulse of the clock signal O_B is aligned with the center point of a pulse of the clock signal O_A. In the example illustrated in FIG. 2, the delay of the clock signal I_A is variably controlled while the delay of the clock signal I_B is fixed, thereby adjusting the relative timing relationship between the clock signal O_B and the clock signal O_A. Alternatively, the delay of the clock signal I_B may be variably controlled while the delay of the clock signal I_A is fixed, thereby adjusting the relative timing relationship between the clock signal O_B and the clock signal O_A.

In this case, the variable-delay circuits 22-1 through 22-3 are controlled such as to impose the same delay length. Accordingly, the timing relationship between the clock signal O_B and the clock signals O_Q and O_Y is adjusted in the same manner as the timing relationship between the clock signal O_B and the clock signal O_A.

For the purpose of properly performing demultiplexing in the parallel processing circuit as illustrated in FIG. 1, the condition that the center point of a pulse of the clock signal O_B is aligned with the center point of a pulse of the clock signal O_A does not require completely accurate alignment, but only requires approximate alignment. The term "approximate alignment" means the condition that the entirety of a HIGH pulse of the clock signal O_B is fully included within the HIGH-pulse period of the clock signal O_A. In the case of the duty cycle of the clock signals O_A and O_Q being accurately 50%, the duty cycle of the clock signal O_B may be within the range of 25% to 75%. In the case of the duty cycle of the clock signal O_B being accurately 50%, on the other hand, the duty cycle of the clock signals O_A and O_Q may be within the range of 37.5% to 62.5%. If all of these three clock signals have duty cycles that are different from 50%, these clock signals share the entire margin to have respective portions thereof. In the case of all the three clock signals accurately having a duty cycle of 50%, the phase displacement between the clock signal O_Q and the clock signal O_A may be within the range of 0 degrees to 180 degrees. In the case of the frequency of the clock signal O_B being equal to the frequency of the clock signal O_A multiplied by a power of two, a HIGH pulse of the clock signal O_B can be positioned at the center of a HIGH pulse of the clock signal O_A. In an example illustrated in FIG. 24, which will be described later, the frequency of the clock signal O_B is twice the frequency of the clock signal O_A.

Figure 3:
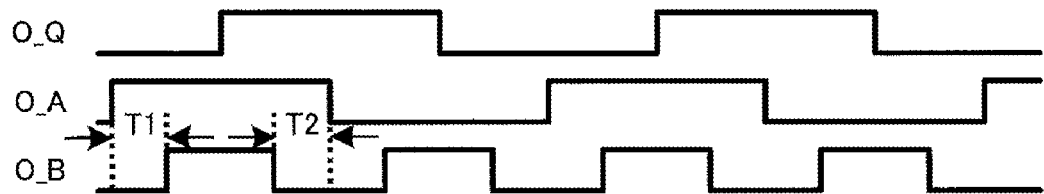
FIG. 3 is a drawing illustrating the timing relationship between a clock signal O_B and clock signals O_A and O_Q.

FIG. 3 is a drawing illustrating the timing relationship between the clock signal O_B and the clock signals O_A and O_Q. Timing adjustment by the timing adjustment circuit illustrated in FIG. 2 achieves a timing relationship between the clock signal O_B and the clock signal O_A such that the center point of a pulse of the clock signal O_B and the center point of a pulse of the clock signal O_A are aligned with each other. Namely, the timing adjustment enables the realization of relative timing between the clock signal O_B and the clock signal O_A such that a time interval T1 and a time interval T2 illustrated in FIG. 3 are equal to each other.

Figure 4:
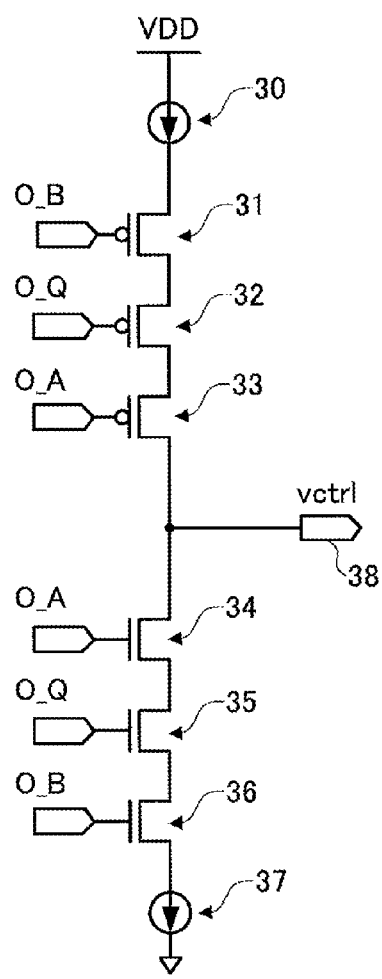
FIG. 4 is a drawing illustrating an example of the configuration of a phase detector.

FIG. 4 is a drawing illustrating an example of the configuration of the phase detector 23. The phase detector 23 illustrated in FIG. 4 includes a constant current source 30, PMOS transistors 31 through 33, NMOS transistors 34 through 36, a constant current source 37, and an output terminal 38. The constant current source 30 may be a PMOS transistor having a constant bias voltage applied to the gate thereof. The constant current source 37 may be an NMOS transistor having a constant bias voltage applied to the gate thereof.

The PMOS transistors 31 through 33 are series-connected and have the gates thereof receiving the clock signals O_B, O_Q, and O_A, respectively. The NMOS transistors 34 through 36 are series-connected and have the gates thereof receiving the clock signals O_A, O_Q, and O_B, respectively. The output terminal 38 outputs the detection signal previously described. The three PMOS transistors 31 through 33 are connected between a power supply voltage VDD and the output terminal 38, and the three NMOS transistors 34 through 36 are connected between the output terminal 38 and the ground voltage.

The asserted period (e.g., HIGH period) of the detection signal vctrl generated at the output terminal 38 is equal to the period in which all the clock signals O_B, O_Q, and O_A are LOW. The negated period (e.g., LOW period) of the detection signal vctrl is equal to the period in which all the clock signals O_B, O_Q, and O_A are HIGH. In other periods, the detection signal vctrl is placed in the HIGH-impedance state (i.e., floating state).

The detection signal vctrl is supplied to the low-pass filter 24 illustrated in FIG. 2. The low-pass filter 24 extracts the low frequency components of the detection signal vctrl to generate a delay control signal for controlling the delay time of the variable-delay circuits 22-1 through 22-3. The detection signal vctrl having the HIGH period thereof longer than the LOW period thereof causes the delay control signal to be a HIGH signal. The detection signal vctrl having the HIGH period thereof shorter than the LOW period thereof causes the delay control signal to be a LOW signal. The detection signal vctrl having the HIGH period thereof equal to the LOW period thereof causes the delay control signal to be substantially zero.

Figure 5:
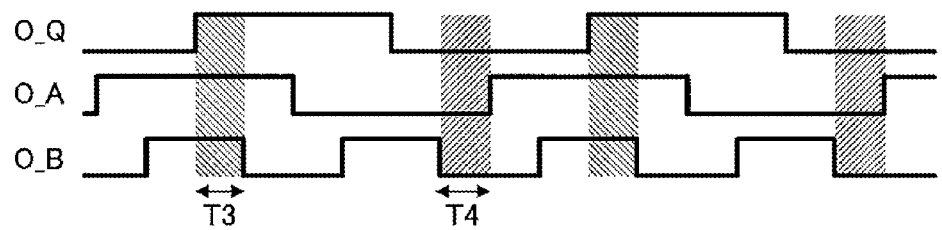
FIG. 5 is a drawing illustrating the clock signals observed when their timing is properly aligned.

FIG. 5 is a drawing illustrating the clock signals observed when their timing is properly aligned. In the state illustrated in FIG. 5, the clock signal O_B is adjusted to proper timing relative to the clock signal O_A and the clock signal O_Q that have a phase displacement of 90 degrees relative to each other. Namely, the center point of a pulse of the clock signal O_B and the center point of a pulse of the clock signal O_A are aligned with each other. The HIGH period of the detection signal vctrl described in connection with FIG. 4 is equal to a period T4 in which all the clock signals O_B, O_Q, and O_A are LOW. The LOW period of the detection signal vctrl is equal to a period T3 in which all the clock signals O_B, O_Q, and O_A are HIGH. In the state in which timing is properly adjusted as illustrated in FIG. 5, the HIGH period (i.e., period T4) and the LOW period (i.e., period T3) of the detection signal vctrl are equal to each other, so that the delay control signal is substantially zero. In response to the delay control signal that is substantially zero, the variable-delay circuits 22-1 through 22-3 illustrated in FIG. 2 may maintain the current delay time (i.e., current delay length) without any change.

Figure 6:
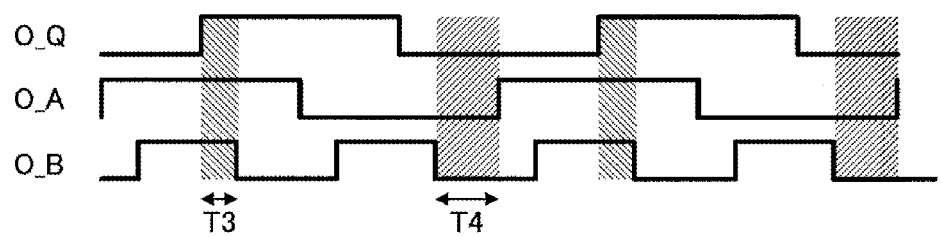
FIG. 6 is a drawing illustrating the clock signals observed when their timing is out of alignment.

FIG. 6 is a drawing illustrating the clock signals observed when their timing is out of alignment. In the state illustrated in FIG. 6, the clock signal O_B is earlier than proper timing relative to the clock signal O_A and the clock signal O_Q that have a phase displacement of 90 degrees relative to each other. Namely, the center point of a pulse of the clock signal O_B is placed at a point in time slightly ahead of the center point of a pulse of the clock signal O_A. The HIGH period of the detection signal vctrl described in connection with FIG. 4 is equal to the period T4 in which all the clock signals O_B, O_Q, and O_A are LOW. The LOW period of the detection signal vctrl is equal to the period T3 in which all the clock signals O_B, O_Q, and O_A are HIGH. In the condition in which the clock signal O_B is earlier than proper timing as illustrated in FIG. 6, the HIGH period (i.e., period T4) of the detection signal vctrl is longer than the LOW period (i.e., period T3) thereof, so that the delay control signal is set to HIGH. In response to the delay control signal that is HIGH, the delay time of the variable-delay circuits 22-1 through 22-3 illustrated in FIG. 2 may be shortened.

Figure 7:
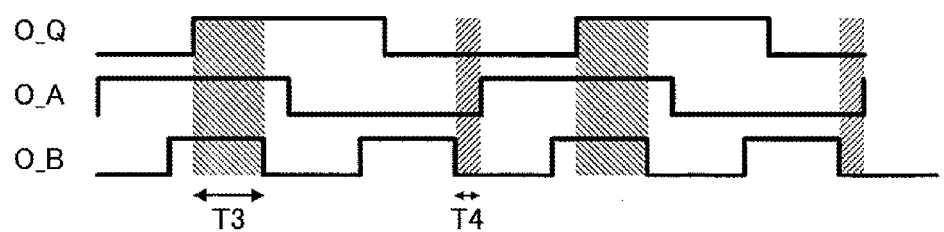
FIG. 7 is a drawing illustrating the clock signals observed when their timing is out of alignment.

FIG. 7 is a drawing illustrating the clock signals observed when their timing is out of alignment. In the state illustrated in FIG. 7, the clock signal O_B is later than proper timing relative to the clock signal O_A and the clock signal O_Q that have a phase displacement of 90 degrees relative to each other. Namely, the center point of a pulse of the clock signal O_B is placed at a point in time slightly behind the center point of a pulse of the clock signal O_A. The HIGH period of the detection signal vctrl described in connection with FIG. 4 is equal to the period T4 in which all the clock signals O_B, O_Q, and O_A are LOW. The LOW period of the detection signal vctrl is equal to the period T3 in which all the clock signals O_B, O_Q, and O_A are HIGH. In the condition in which the clock signal O_B is later than proper timing as illustrated in FIG. 7, the HIGH period (i.e., period T4) of the detection signal vctrl is shorter than the LOW period (i.e., period T3) thereof, so that the delay control signal is set to LOW. In response to the delay control signal that is LOW, the delay time of the variable-delay circuits 22-1 through 22-3 illustrated in FIG. 2 may be extended.

As is understood from FIG. 5 through FIG. 7, the HIGH period (i.e., period T4) of the detection signal vctrl has the length thereof responsive to the timing relationship between the clock signal O_A and the clock signal O_B. Further, the LOW period (i.e., period T3) of the detection signal vctrl has the length thereof responsive to the timing relationship between the clock signal O_Q and the clock signal O_B. In this manner, the detection signal vctrl generated by the phase detector 23 is a signal indicative of the timing relationship between the clock signal O_A and the clock signal O_B and the timing relationship between the clock signal O_Q and the clock signal O_B.

Figure 8:
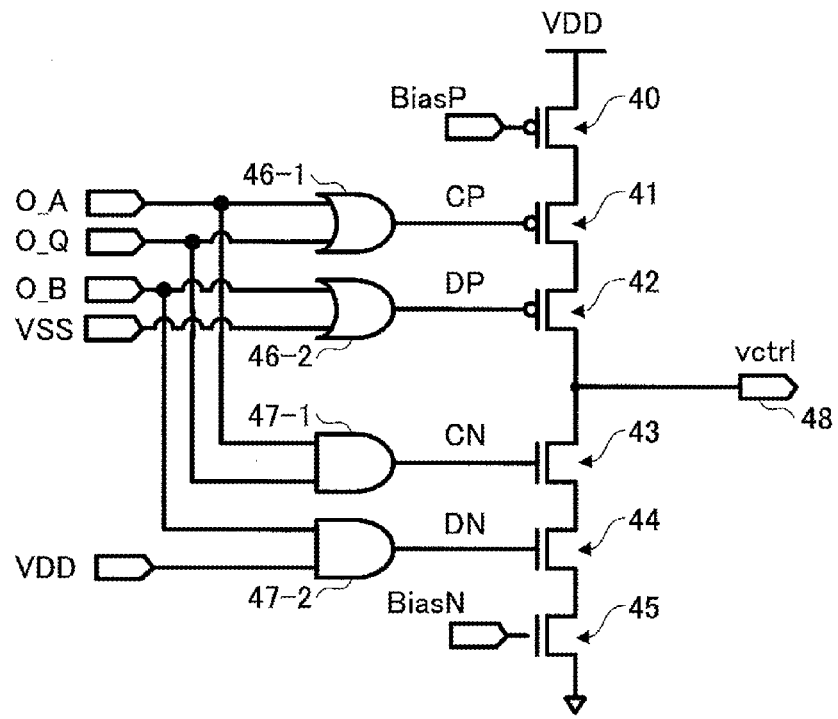
FIG. 8 is a drawing illustrating another example of the configuration of the phase detector.

FIG. 8 is a drawing illustrating another example of the configuration of the phase detector 23. The phase detector 23 illustrated in FIG. 8 includes a constant current source 40, PMOS transistors 41 and 42, NMOS transistors 43 and 44, a constant current source 45, OR gates 46-1 and 46-2, AND gates 47-1 and 47-2, and an output terminal 48. The constant current source 40 may be a PMOS transistor having a constant bias voltage BiasP applied to the gate thereof. The constant current source 45 may be an NMOS transistor having a constant bias voltage BiasN applied to the gate thereof.

The logic circuit implemented by the OR gates 46-1 and 46-2 receives the clock signals O_B, O_Q and O_A to produce two outputs CP and DP. These two outputs CP and DP are applied to the gates of the PMOS transistors 41 and 42, respectively. The logic circuit implemented by the AND gates 47-1 and 47-2 receives the clock signals O_B, O_Q and O_A to produce two outputs CN and DN. These two outputs CN and DN are applied to the gates of the NMOS transistors 43 and 44, respectively. At least two PMOS transistors 41 and 42 connect between the power supply voltage VDD and the output terminal 48. At least two NMOS transistors 43 and 44 connect between the output terminal 48 and the ground voltage.

The HIGH period of the detection signal vctrl generated at the output terminal 48 is equal to the period in which all the clock signals O_B, O_Q, and O_A are LOW. The same logic operation may be realized by use of an arrangement in which the configuration of the logic circuit implemented by the OR gates 46-1 and 46-2 is changed to produce one output, which is applied to the gate of one PMOS transistor. The LOW period of the detection signal is equal to the period in which all the clock signals O_B, O_Q, and O_A are HIGH. The same logic operation may be realized by use of an arrangement in which the configuration of the logic circuit implemented by the AND gates 47-1 and 47-2 is changed to produce one output, which is applied to the gate of one NMOS transistor.

The phase detector 23 illustrated in FIG. 8 and the phase detector 23 illustrated in FIG. 4 differ from each other only in the specific configuration in which their logic circuits are implemented. The input-and-output relationships between the logic values of the input clock signals and the logic values of the output detection signal are the same between these two phase detectors 23. In the case of the phase detector 23 illustrated in FIG. 4, eight MOS transistors are series-connected between the power supply voltage and the ground voltage. With this configuration, the use of a low power supply voltage causes the MOS transistors to operate outside their saturation region, which is generally not desirable. In the case of the phase detector 23 illustrated in FIG. 8, on the other hand, only six MOS transistors are series-connected between the power supply voltage and the ground voltage, which enables proper operations even with a relatively low power supply voltage.

Figure 9:
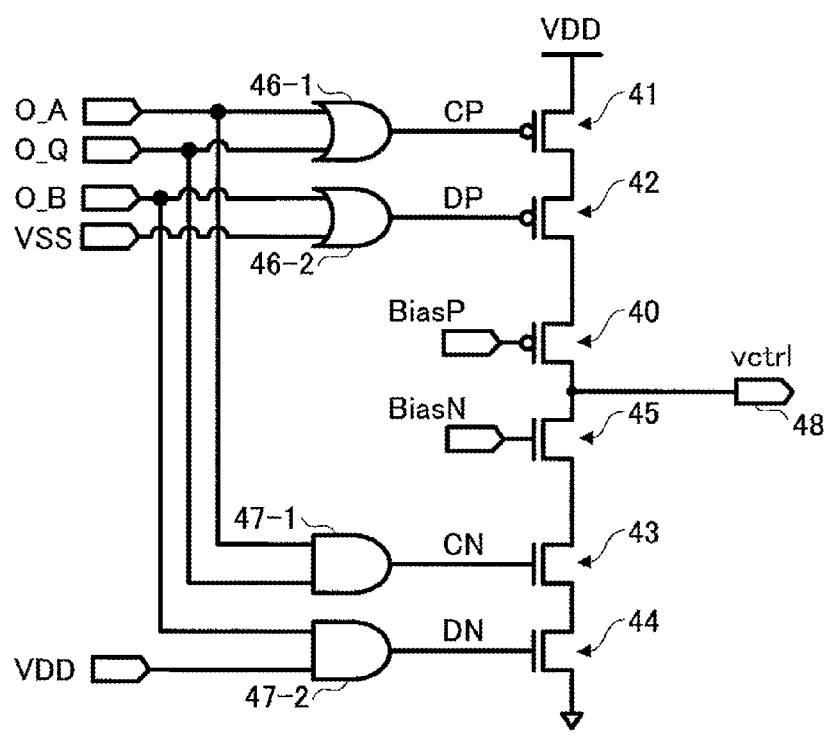
FIG. 9 is a drawing illustrating yet another example of the configuration of the phase detector.

FIG. 9 is a drawing illustrating yet another example of the configuration of the phase detector 23. In FIG. 9, the same or corresponding elements as those of FIG. 8 are referred to by the same or corresponding numerals, and a description thereof will be omitted as appropriate. In the phase detector 23 illustrated in FIG. 9, the constant current source 40 and the constant current source 45 are moved to such positions as to be directly connected to the output terminal 48 as compared with the phase detector 23 illustrated in FIG. 8. Similarly, the constant current sources may be moved to other suitable positions without affecting the operation of generating the detection signal vctrl at the output terminal 48.

Figure 10:
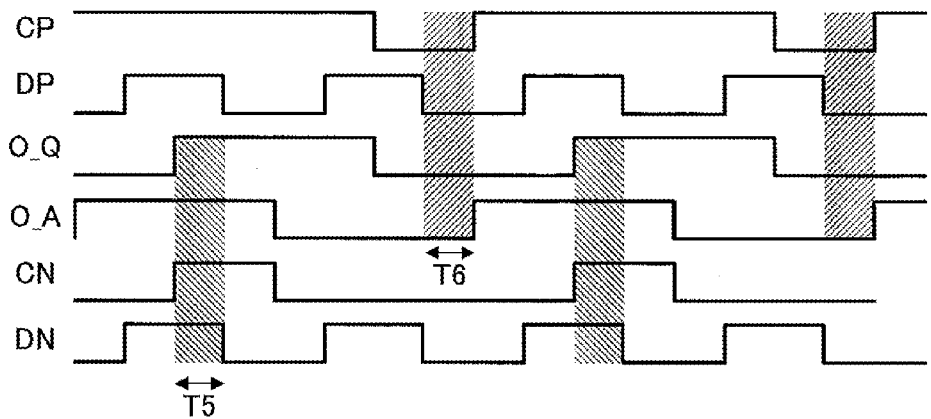
FIG. 10 is a drawing illustrating the signal waveforms of the phase detectors illustrated in FIG. 8 and FIG. 9 as observed when timing is properly aligned.

FIG. 10 is a drawing illustrating the signal waveforms of the phase detectors illustrated in FIG. 8 and FIG. 9 as observed when timing is properly aligned. In the condition illustrated in FIG. 10, the clock signal O_B (which is the same as the signal DP and the signal DN) is adjusted to proper timing relative to the clock signal O_A and the clock signal O_Q that have a phase displacement of 90 degrees relative to each other. Namely, the center point of a pulse of the clock signal O_B (i.e., signals DP and DN) is aligned with the center point of a pulse of the clock signal O_A. In the state in which timing is properly adjusted as illustrated in FIG. 10, the HIGH period (i.e., period T6) and the LOW period (i.e., period T5) of the detection signal vctrl are equal to each other, so that the delay control signal supplied to the variable-delay circuits 22-1 through 22-3 is substantially zero.

Figure 11:
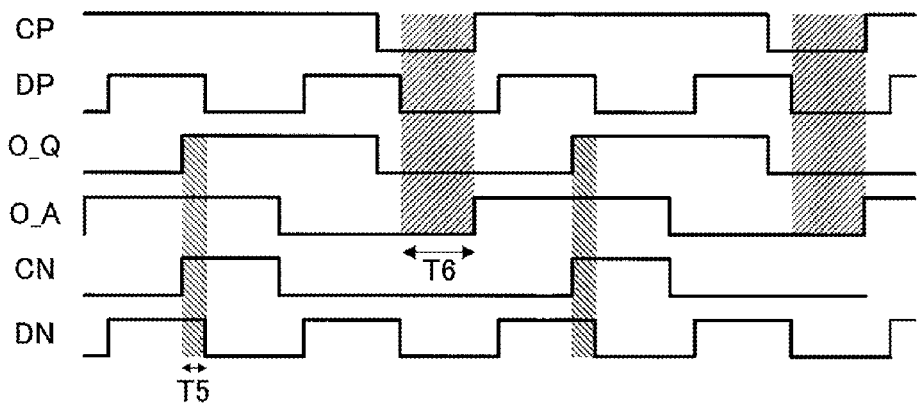
FIG. 11 is a drawing illustrating the signal waveforms of the phase detectors illustrated in FIG. 8 and FIG. 9 as observed when timing is out of alignment.

FIG. 11 is a drawing illustrating the signal waveforms of the phase detectors illustrated in FIG. 8 and FIG. 9 as observed when timing is out of alignment. In the condition illustrated in FIG. 11, the clock signal O_B (which is the same as the signal DP and the signal DN) is earlier than proper timing relative to the clock signal O_A and the clock signal O_Q that have a phase displacement of 90 degrees relative to each other. Namely, the center point of a pulse of the clock signal O_B (i.e., signals DP and DN) is placed at a point in time slightly ahead of the center point of a pulse of the clock signal O_A. In the condition in which the clock signal O_B is earlier than proper timing as illustrated in FIG. 11, the HIGH period (i.e., period T6) of the detection signal vctrl is longer than the LOW period (i.e., period T5) thereof, so that the delay control signal supplied to the variable-delay circuits is set to HIGH.

Figure 12:
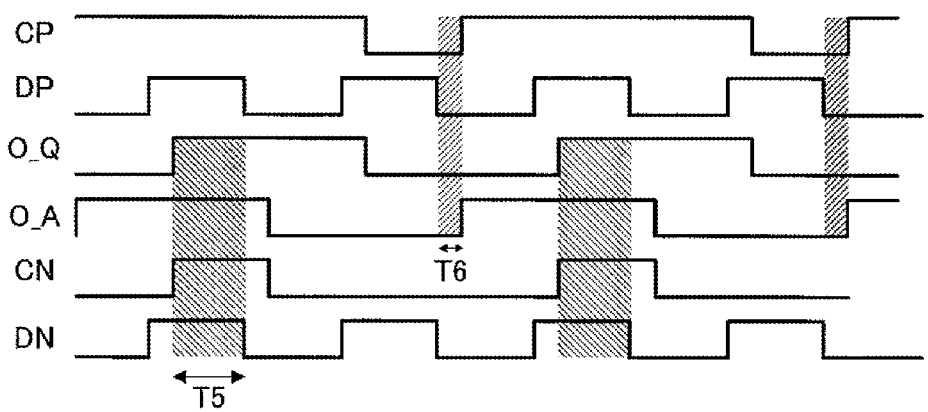
FIG. 12 is a drawing illustrating the signal waveforms of the phase detectors illustrated in FIG. 8 and FIG. 9 as observed when timing is out of alignment.

FIG. 12 is a drawing illustrating the signal waveforms of the phase detectors illustrated in FIG. 8 and FIG. 9 as observed when timing is out of alignment. In the condition illustrated in FIG. 12, the clock signal O_B (which is the same as the signal DP and the signal DN) is later than proper timing relative to the clock signal O_A and the clock signal O_Q that have a phase displacement of 90 degrees relative to each other. Namely, the center point of a pulse of the clock signal O_B (i.e., signals DP and DN) is placed at a point in time slightly behind the center point of a pulse of the clock signal O_A. In the condition in which the clock signal O_B is later than proper timing as illustrated in FIG. 12, the HIGH period (i.e., period T6) of the detection signal vctrl is shorter than the LOW period (i.e., period T5) thereof, so that the delay control signal supplied to the variable-delay circuits is set to LOW.

Figure 13:
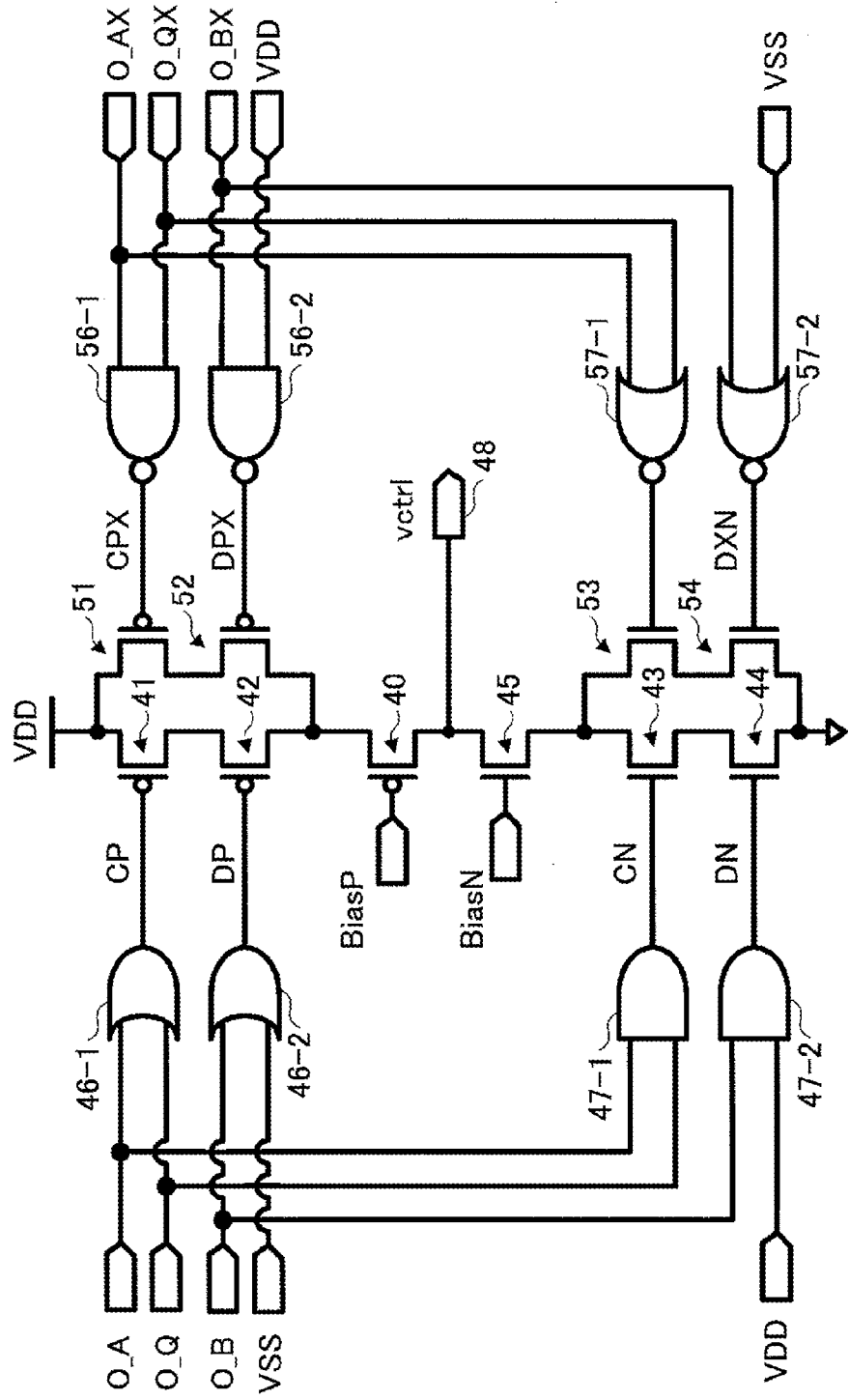
FIG. 13 is a drawing illustrating yet another example of the configuration of the phase detector.

FIG. 13 is a drawing illustrating yet another example of the configuration of the phase detector 23. In FIG. 13, the same or corresponding elements as those of FIG. 8 and FIG. 9 are referred to by the same or corresponding numerals, and a description thereof will be omitted as appropriate. The phase detector 23 illustrated in FIG. 13 includes a constant current source 40, PMOS transistors 41 and 42, NMOS transistors 43 and 44, a constant current source 45, OR gates 46-1 and 46-2, AND gates 47-1 and 47-2, and an output terminal 48. The phase detector 23 further includes PMOS transistors 51 and 52, NMOS transistors 53 and 54, a constant current source 55, NAND gates 56-1 and 56-2, and NOR gates 57-1 and 57-2.

Clock signals O_AX, O_QX and O_BX are the inverses of the clock signals O_A, O_Q and O_B, respectively. The phase detector 23 illustrated in FIG. 13 is designed for use in a configuration in which the parallel processing circuit illustrated in FIG. 1 and the timing adjustment circuit illustrated in FIG. 2 are designed to operate with differential signals. Even in the case of using such a differential configuration, the use of a phase detector as illustrated in FIG. 8 or 9 that receives only the non-inverted clock signals O_A, O_Q and O_B does not cause any problem. When the non-inverted clock signals O_A, O_Q and O_B are used in the phase detector 23 while the inverted clock signals O_AX, O_QX and O_BX are not used in the phase detector 23, however, the loads on these clock signals are imbalanced. In order to bring about a balance, a dummy phase detector that receives the inverted clock signals O_AX, O_QX and O_BX may be provided. It may be more preferable, however, to implement the phase detector 23 having a differential configuration as illustrated in FIG. 13 than providing such a dummy circuit.

Further, there may be no guarantee that the clock signals O_AX, O_QX and O_BX are exactly the inverses of the clock signals O_A, O_Q and O_B, respectively, without any timing displacement. The use of the phase detector 23 having a differential configuration as illustrated in FIG. 13 serves to average out the timing displacements to enable the realization of a balanced delay adjustment operation.

Figure 14:
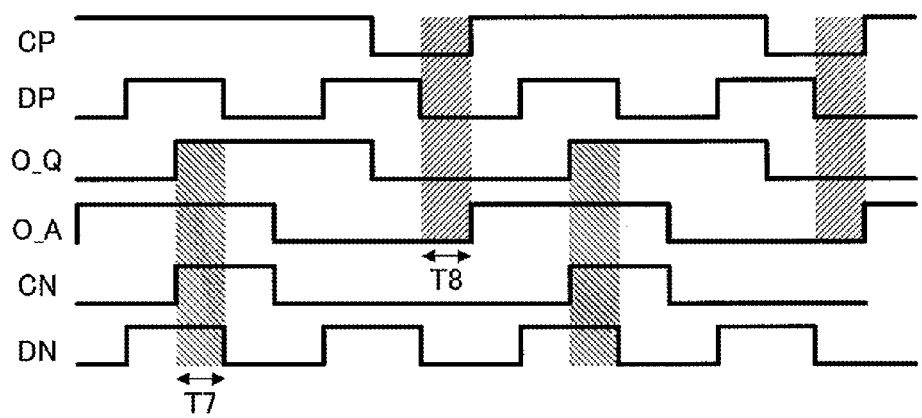
FIG. 14 is a drawing illustrating the non-inverted-side signal waveforms of the phase detector illustrated in FIG. 13 as observed when timing is properly aligned.

FIG. 14 is a drawing illustrating the non-inverted-side signal waveforms of the phase detector illustrated in FIG. 13 as observed when timing is properly aligned. In the condition illustrated in FIG. 14, the clock signal O_B (which is the same as the signal DP and the signal DN) is adjusted to proper timing relative to the clock signal O_A and the clock signal O_Q that have a phase displacement of 90 degrees relative to each other. Namely, the center point of a pulse of the clock signal O_B (i.e., signals DP and DN) is aligned with the center point of a pulse of the clock signal O_A.

Figure 15:
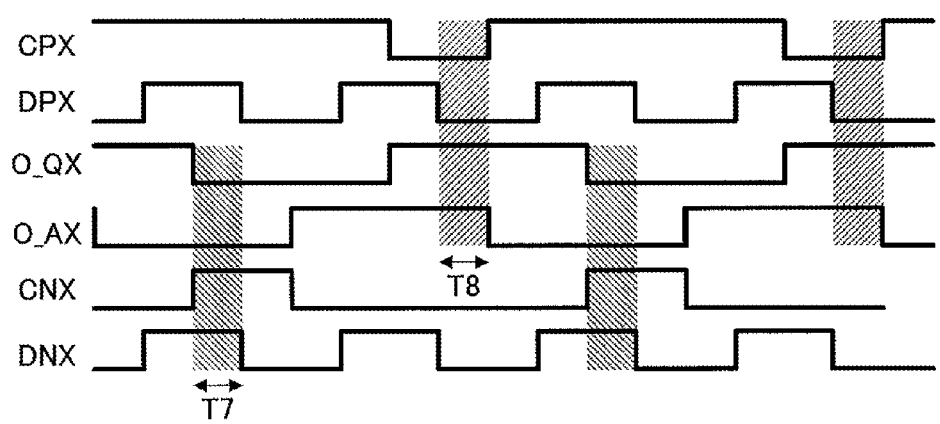
FIG. 15 is a drawing illustrating the inverted-side signal waveforms of the phase detector illustrated in FIG. 13 as observed when timing is properly aligned.

FIG. 15 is a drawing illustrating the inverted-side signal waveforms of the phase detector illustrated in FIG. 13 as observed when timing is properly aligned. In the condition illustrated in FIG. 14, the clock signal O_BX (which is the same as the signal DP and the signal DN) is adjusted to proper timing relative to the clock signal O_AX and the clock signal O_QX that have a phase displacement of 90 degrees relative to each other.

In the state in which timing is properly adjusted as illustrated in FIG. 15, the HIGH period (i.e., period T8) and the LOW period (i.e., period T7) of the detection signal vctrl are equal to each other, so that the delay control signal supplied to the variable-delay circuits 22-1 through 22-3 is substantially zero. Accordingly, the delay time of the variable-delay circuits 22-1 through 22-3 does not change, and maintains the current value.

Figure 16:
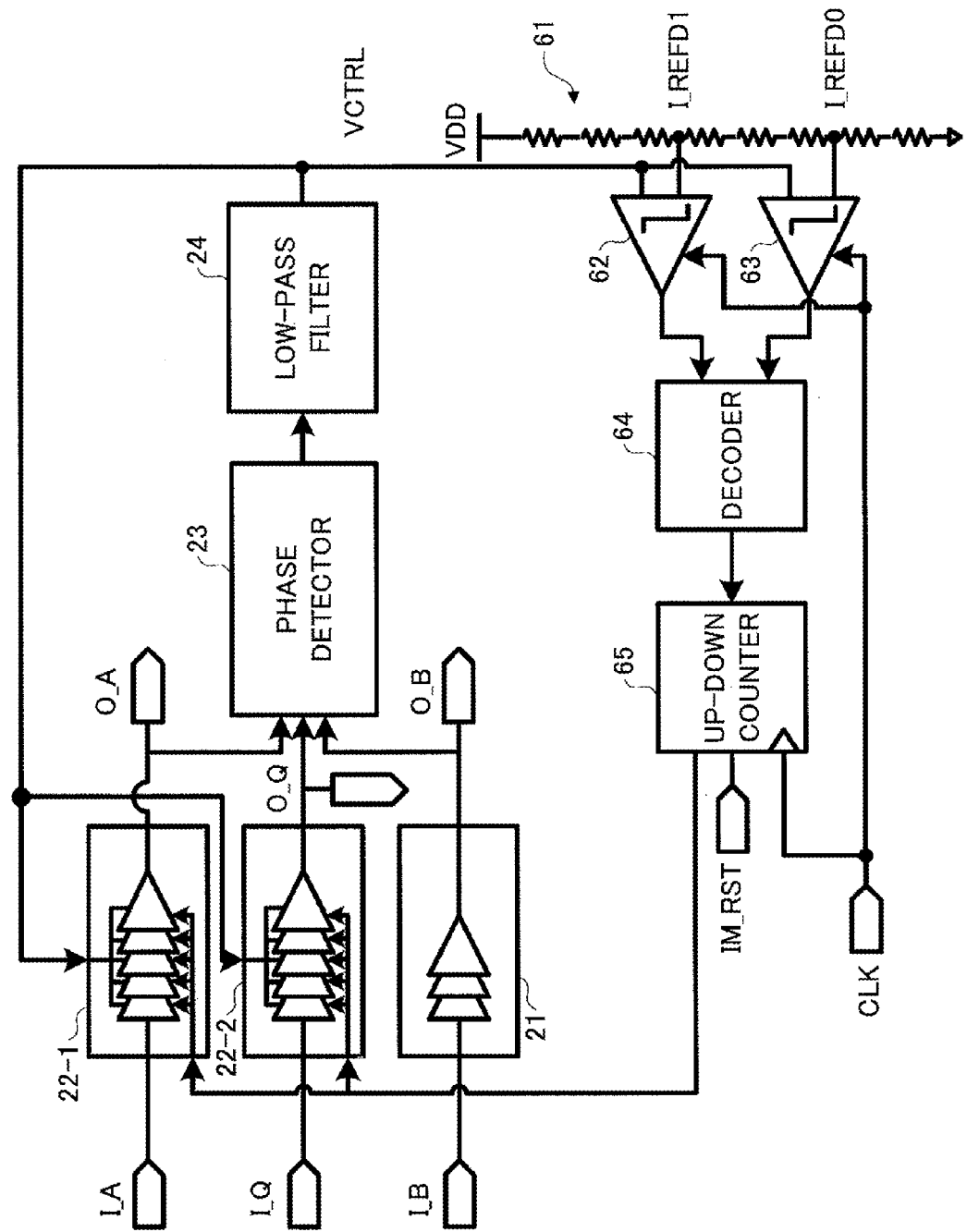
FIG. 16 is a drawing illustrating another example of the configuration of the timing adjustment circuit.

FIG. 16 is a drawing illustrating another example of the configuration of the timing adjustment circuit. In FIG. 16, the same or corresponding elements as those of FIG. 2 are referred to by the same or corresponding numerals, and a description thereof will be omitted as appropriate. The timing adjustment circuit illustrated in FIG. 16 includes a delay circuit 21, variable-delay circuits 22-1 and 22-2, a phase detector 23, a low-pass filter 24, a resistor series 61, comparison circuits 62 and 63, a decoder 64, and an up-down counter 65.

The delay circuit 21, the variable-delay circuits 22-1 and 22-2, the phase detector 23, and the low-pass filter 24 correspond to a fine-adjustment circuit. The resistor series 61, the comparison circuits 62 and 63, the decoder 64, and the up-down counter 65 correspond to a coarse-adjustment circuit. The coarse-adjustment circuit performs coarse adjustment, followed by fine adjustment performed by the fine-adjustment circuit, which enables the efficient realization of both a broad range of timing adjustment and a high accuracy of timing adjustment.

Each of the variable-delay circuits 22-1 and 22-2 adjusts the relative timing relationship, by a step size of a first time length, between the clock signal O_B and the clock signal O_A in response to the output of the low-pass filter 24 through the operation of the fine-adjustment circuit. At the same time, each of the variable-delay circuits 22-1 and 22-2 adjusts the relative timing relationship, by a step size of a second time length longer than the first time length, between the clock signal O_B and the clock signal O_A in response to the output of the low-pass filter 24 through the operation of the coarse-adjustment circuit.

The resistor series 61 divides the power supply voltage VDD to generate two different voltages. The comparison circuit 62 compares one of the two voltages with the output voltage of the low-pass filter 24. The comparison circuit 63 compares the other one of the two voltages with the output voltage of the low-pass filter 24. The decoder 64 decodes the results of comparison obtained by the comparison circuits 62 and 63 to output a decode result. The up-down counter 65 increases or decreases an output count value in response to the decode result. The delay time of the variable-delay circuits 22-1 and 22-2 is coarsely adjusted by the output count value of the up-down counter 65. Further, the delay time of the variable-delay circuits 22-1 and 22-2 is finely adjusted by the output voltage of the low-pass filter 24. Such a fine adjustment operation is the same as or similar to the adjustment operation previously described in connection with FIG. 2 through FIG. 7.

Figure 17:
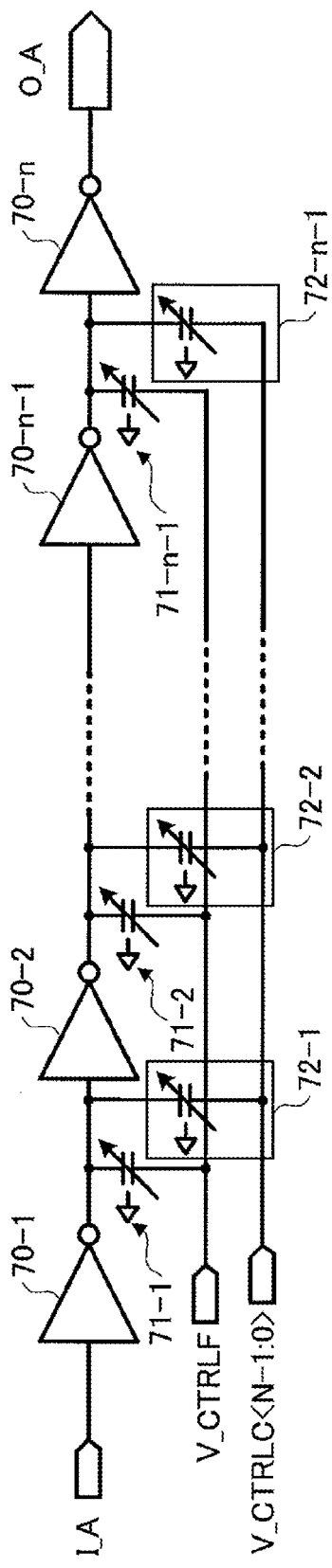
FIG. 17 is a drawing illustrating an example of the configuration of a variable-delay circuit.

FIG. 17 is a drawing illustrating an example of the configuration of a variable-delay circuit. The variable-delay circuit illustrated in FIG. 17 may be used as each of the variable-delay circuits 22-1 and 22-2 of the timing adjustment circuit illustrated in FIG. 16.

The variable-delay circuit illustrated in FIG. 17 includes n inverters 70-1 through 70-$n$ (n: an integer that is 2 or larger), n−1 variable-capacitance devices 71-1 through 71-$n$−1, and n−1 variable-capacitance circuits 72-1 through 72-$n$−1. The inverters 70-1 through 70-$n$ are connected in cascade such that the output of a given stage is input into the next stage, thereby allowing a clock signal to propagate therethrough. The variable-capacitance devices 71-1 through 71-$n$−1 may be variable-capacitance diodes, which have the capacitance thereof varying in response to a control voltage V_CTRLF that is output from the low-pass filter 24 illustrated in FIG. 16. The variable-capacitance circuits 72-1 through 72-$n$−1 receive a control signal V_CTRLC<N−1:0> that is an N-bit count value (N: an integer that is 2 or larger) output from the up-down counter 65 illustrated in FIG. 16. The capacitance of the variable-capacitance circuits 72-1 through 72-$n$−1 are set to a capacitance value responsive to the value of the control signal V_CTRLC<N−1:0>. With this arrangement, the capacitances of the signal lines connected to the inputs and outputs of the inverters 70-1 through 70-$n$ are changed, thereby adjusting the delay time of a signal propagating the signal lines.

Figure 18:
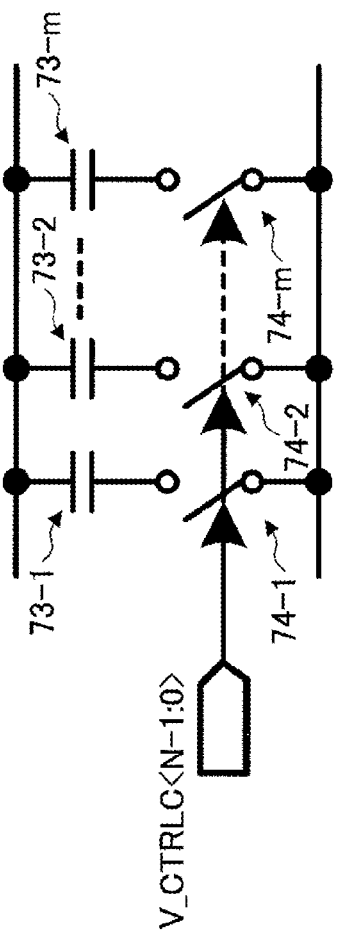
FIG. 18 is a drawing illustrating an example of the configuration of a variable-capacitance circuit.

FIG. 18 is a drawing illustrating an example of the configuration of a variable-capacitance circuit. The variable-capacitance circuit illustrated in FIG. 18 may be used as each of the variable-capacitance circuits 72-1 through 72-$n$−1 illustrated in FIG. 17. The variable-capacitance circuit illustrated in FIG. 18 includes capacitor devices 73-1 through 73-$m$ (m: an integer that is 2 or larger) and switch circuits 74-1 through 74-$m$. One end of each of the capacitor devices 73-1 through 73-$m$ is connected to the signal line connected to one of the inputs of the inverters 70-1 through 70-$n$ illustrated in FIG. 17, and the other end of each of the capacitor devices 73-1 through 73-$m$ is connected to a ground line via a corresponding one of the switch circuits 74-1 through 74-$m$. As many switch circuits as the number indicated by the N-bit control signal V_CTRLC<N−1:0>, among the m switch circuits 74-1 through 74-$m$, are placed in the conductive state, and the remaining switch circuits are placed in the non-conductive state.

Figure 19:
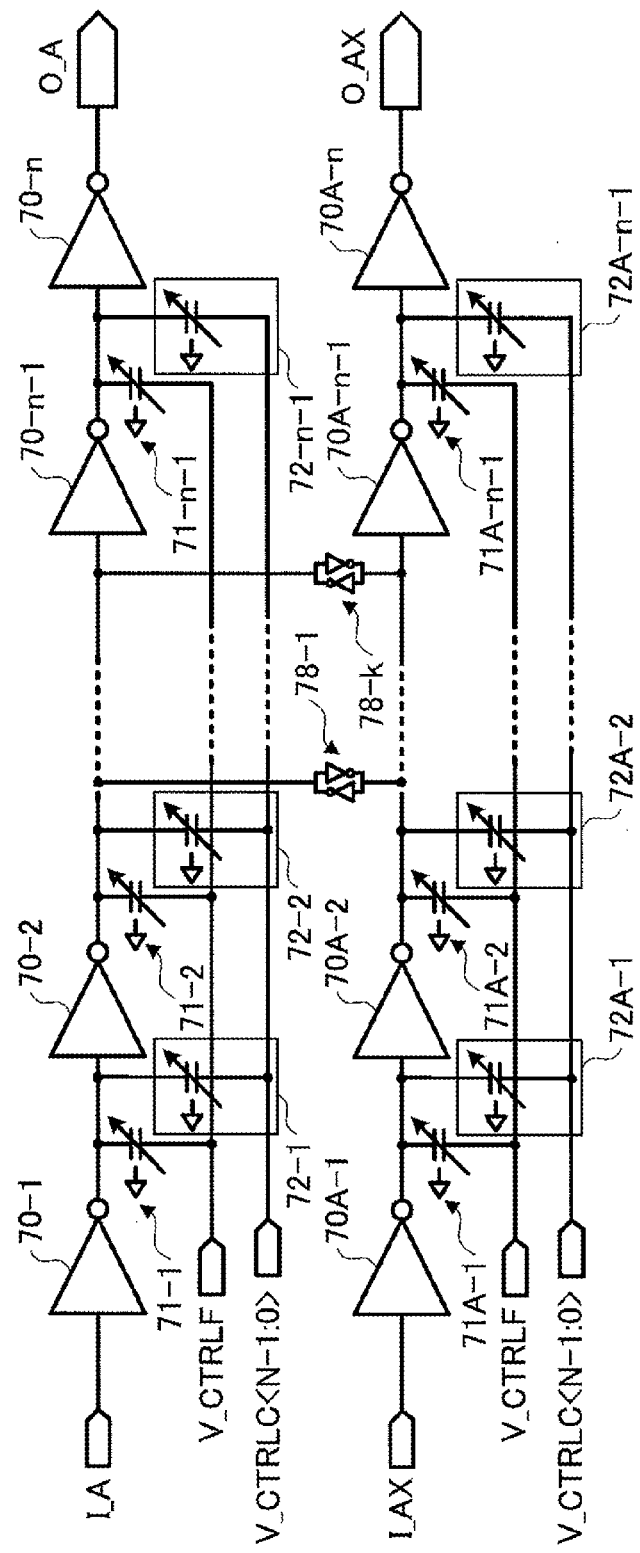
FIG. 19 is a drawing illustrating an example of the configuration of a variable-delay circuit when the signal to be delayed is a differential signal.

FIG. 19 is a drawing illustrating an example of the configuration of a variable-delay circuit when the signal to be delayed is a differential signal. In FIG. 19, the same or corresponding elements as those of FIG. 17 are referred to by the same or corresponding numerals, and a description thereof will be omitted as appropriate. The variable-delay circuit illustrated in FIG. 19 includes n inverters 70-1 through 70-$n$ (n: an integer that is 2 or larger), n−1 variable-capacitance devices 71-1 through 71-$n$−1, and n−1 variable-capacitance circuits 72-1 through 72-$n$−1. The variable-delay circuit illustrated in FIG. 19 further includes n inverters 70A-1 through 70-A$n$, n−1 variable-capacitance devices 71A-1 through 71A-$n$−1, and n−1 variable-capacitance circuits 72A-1 through 72A-$n$−1. The variable-delay circuit illustrated in FIG. 19 further includes k inverter units 78-1 through 78-$k$ (k: an integer that is 2 or larger).

The circuit portion including the inverters 70-1 through 70-$n$, the variable-capacitance devices 71-1 through 71-$n$−1, and the variable-capacitance circuits 72-1 through 72-$n$−1 are the same as or similar to the variable-delay circuit illustrated in FIG. 17. The inverters 70A-1 through 70A-$n$ may have the same or similar configuration as the inverters 70-1 through 70-$n$, and are connected in cascade such that the output of a given stage is input into the next stage, thereby allowing the propagation of a clock signal. The variable-capacitance devices 71A-1 through 71A-$n$−1 and the variable-capacitance circuits 72A-1 through 72A-$n$−1 may have the same or similar configuration as the variable-capacitance devices 71-1 through 71-$n$−1 and the variable-capacitance circuits 72-1 through 72-$n$−1, respectively.

The inverter units 78-1 through 78-$k$ connect between the signal lines connecting the inputs and outputs of the inverters 70-1 through 70-$n$ and the signal lines connecting the inputs and outputs of the inverters 70A-1 through 70A-$n$. Such a connection between two sides is provided by use of two inverters each of which receives an input from one side and provides an output to the other side. The inverter units 78-1 through 78-$k$ serve to maintain the inverted-logic-value relationship between the signal lines on one side and the signal lines on the other side.

Figure 20:
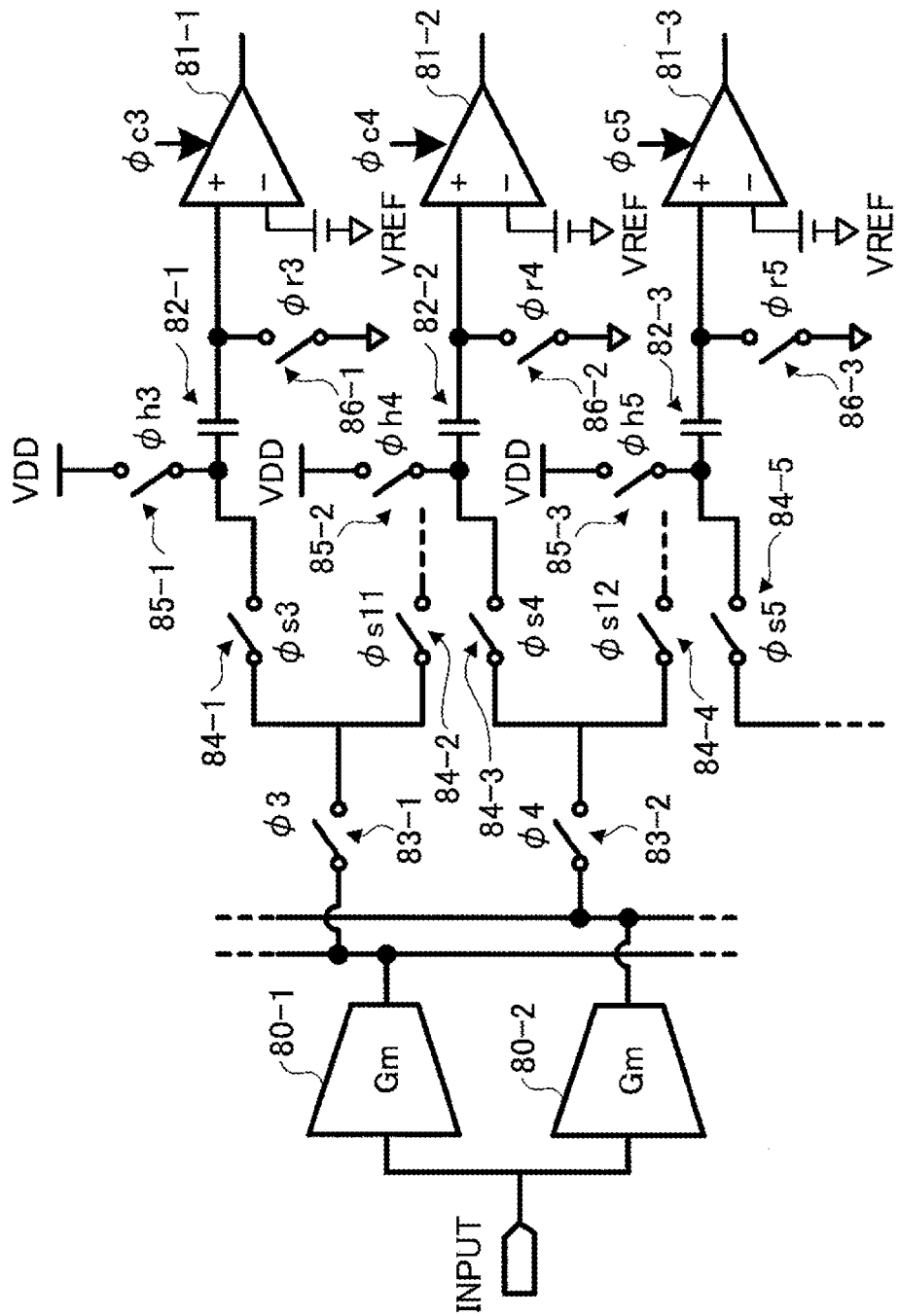
FIG. 20 is a drawing illustrating another example of the configuration of a parallel processing circuit.

FIG. 20 is a drawing illustrating another example of the configuration of the parallel processing circuit. The parallel processing circuit illustrated in FIG. 20 includes transconductance amplifiers 80-1 and 80-2, comparison circuits 81-1 through 81-3, capacitor devices 82-1 through 82-3, switch circuits 83-1 and 83-2, and switch circuits 84-1 through 84-5. The parallel processing circuit further includes switch circuits 85-1 through 85-3 and switch circuits 86-1 and 86-3. The circuit illustrated in FIG. 20 is a portion of a parallel processing circuit that demultiplexes a multiplexed signal supplied into an input terminal INPUT into 16 signals, for example, and performs parallel processing with respect to the 16 demultiplexed signals to produce 16 outputs in parallel.

The multiplexed signal supplied to the input terminal INPUT is amplified by the transconductance amplifiers 80-1 and 80-2, and is then demultiplexed by the switch circuits 83-1 and 83-2 and the switch circuits 84-1 through 84-5. The demultiplexed signals are subjected to sample, hold, and reset operations by the capacitor devices 82-1 through 82-3, the switch circuits 84-1 through 84-5, the switch circuits 85-1 through 85-3, and the switch circuits 86-1 and 86-3. The sampled and held demultiplexed signals are applied to the non-inverted inputs of the comparison circuits 81-1 through 81-3. Each of the comparison circuits 81-1 through 81-3 compares the demultiplexed signal input into the non-inverted input thereof with a reference potential VREF applied to the inverted input thereof, thereby outputting the result of comparison to a corresponding one of the output terminals. Demultiplexing by the switch circuits enables the realization of high-speed signal changes, thereby enabling parallel comparison processes to be performed with respect to a high-speed input multiplexed signal.

The switch circuits 83-1 and 83-2 continue to open and close in synchronization with clock signals φ3 and φ4, respectively. The switch circuits 84-1 through 84-5 continue to open and close in synchronization with clock signals φs3, φs11, φs4, φs12, and φs5, respectively. The switch circuits 85-1 through 85-3 continue to open and close in synchronization with clock signals φh3 through φh5, respectively. The switch circuits 86-1 through 86-3 continue to open and close in synchronization with clock signals φr3 through φr5, respectively.

Figure 21:
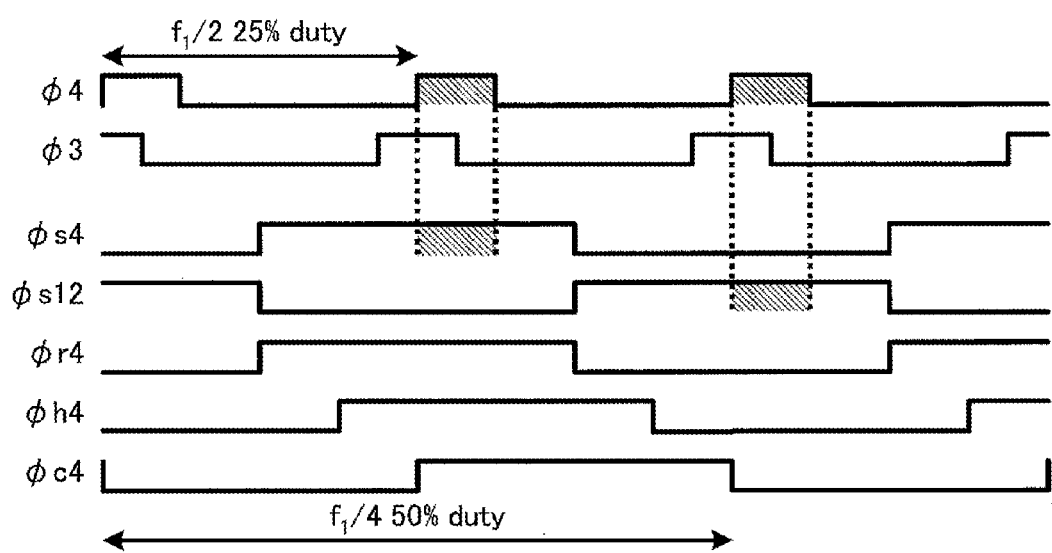
FIG. 21 is a drawing illustrating an example of the waveforms of the clock signals used in the parallel processing circuit illustrated in FIG. 20.

FIG. 21 is a drawing illustrating an example of the waveforms of the clock signals used in the parallel processing circuit illustrated in FIG. 20. FIG. 21 illustrates only the representative clock signals suitable for the purpose of explaining the operation of the parallel processing circuit illustrated in FIG. 20. As illustrated in FIG. 21, the clock signals φ3 and φ4 have predetermined frequency $f_1/2$ and a duty cycle of 25%. The clock signals φs4, φs12, φr4, φh4, and φc4 have frequency $f_1/4$ and a duty cycle of 50%. Among the switch circuits illustrated in FIG. 20, only the switch circuits 85-1 through 85-3 become conductive when the clock signal is LOW, and become nonconductive when the clock signal is HIGH. The remaining switch circuits become conductive when the clock signal is HIGH, and become nonconductive when the clock signal is LOW.

In the following, a description will be given of the sample and hold operations performed by the capacitor device 82-2 illustrated in FIG. 20. In FIG. 21, φh4 and φr4 are LOW in the initial state, so that the switch circuit 85-2 is conductive, and the switch circuit 86-2 is nonconductive. From this state, φr4 changes to HIGH, thereby making the switch circuit 86-2 conductive. At this time, the capacitor device 82-2 is placed between the power supply voltage VDD and the ground voltage, so that the capacitor device 82-2 is placed in the reset state in which it is charged with the power supply voltage VDD.

After this, φh4 changes to HIGH, thereby making the switch circuit 85-2 nonconductive. As a result, the capacitor device 82-2 is separated from the power supply voltage VDD but is still connected to the ground voltage. At this time, the φs4 is also HIGH, so that the switch circuit 84-3 becomes conductive. Subsequently, φ4 changes to HIGH, causing the switch circuit 83-2 to become conductive, so that the capacitor device 82-2 is discharged by the multiplexed signal supplied to the input terminal INPUT. This sampling operation causes the capacitor device 82-2 to be discharged to the voltage responsive to the input multiplexed signal. Thereafter, φ4 and φs4 change to LOW, so that the capacitor device 82-2 is disconnected from the input side, followed by φr4 becoming LOW, resulting in the switch circuit 86-2 becoming nonconductive, which causes the capacitor device 82-2 to be also separated from the ground voltage. Subsequently, φh4 changes to LOW, causing the switch circuit 85-2 to be conductive, so that the sampled voltage of the input multiplexed signal is applied to the non-inverted input of the comparison circuit 81-2.

In the parallel processing circuit illustrated in FIG. 20 and FIG. 21, clock signals having predetermined frequency $f_1/2$ and a duty cycle of 25% such as φ3 and φ4 are used. Further, clock signals having frequency $f_1/4$ and a duty cycle of 50% such as φs4, φs12, φr4, φh4, and φc4 are used. Accordingly, it is desirable to generate these various clock signals having desired timing relationships therebetween.

Figure 22:
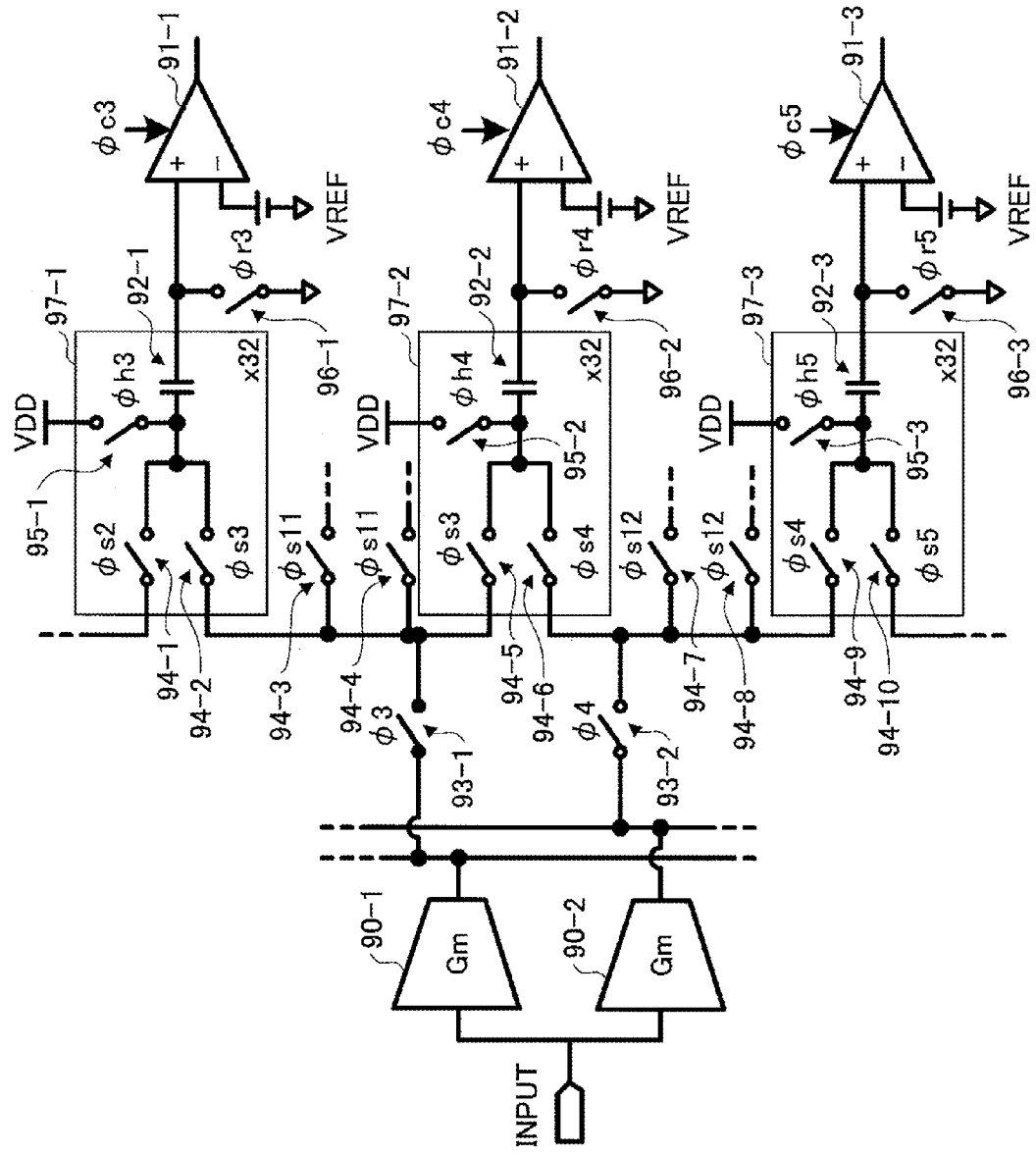
FIG. 22 is a drawing illustrating yet another example of the configuration of a parallel processing circuit.

FIG. 22 is a drawing illustrating yet another example of the configuration of the parallel processing circuit. The parallel processing circuit illustrated in FIG. 22 includes transconductance amplifiers 90-1 and 90-2, comparison circuits 91-1 through 91-3, capacitor devices 92-1 through 92-3, switch circuits 93-1 and 93-2, and switch circuits 94-1 through 94-10. The parallel processing circuit further includes switch circuits 95-1 through 95-3 and switch circuits 96-1 and 96-3. The circuit illustrated in FIG. 22 is a portion of a parallel processing circuit that demultiplexes a multiplexed signal supplied into an input terminal INPUT into 16 signals, for example, and performs parallel processing with respect to the 16 demultiplexed signals to produce 16 outputs in parallel.

Interpolation units 97-1 through 97-3 are each provided as a set of 32 identical units. Each of the 32 interpolation units 97-1 includes switch circuits 94-1 and 94-2, a switch circuit 95-1, and a capacitor device 92-1. Each of the 32 interpolation units 97-2 includes switch circuits 94-5 and 94-6, a switch circuit 95-2, and a capacitor device 92-2. Each of the 32 interpolation units 97-3 includes switch circuits 94-9 and 94-10, a switch circuit 95-3, and a capacitor device 92-3.

The multiplexed signal supplied to the input terminal INPUT is amplified by the transconductance amplifiers 90-1 and 90-2, and is then demultiplexed by the switch circuits 93-1 and 93-2 and the switch circuits 94-1 through 94-10. The demultiplexed signals are subjected to sample, hold, and reset operations by the capacitor devices 92-1 through 92-3, the switch circuits 94-1 through 94-10, the switch circuits 95-1 through 95-3, and the switch circuits 96-1 and 96-3. The sampled and held demultiplexed signals are applied to the non-inverted inputs of the comparison circuits 91-1 through 91-3. Each of the comparison circuits 91-1 through 91-3 compares the demultiplexed signal input into the non-inverted input thereof with a reference potential VREF applied to the inverted input thereof, thereby outputting the result of comparison to a corresponding one of the output terminals. Demultiplexing by the switch circuits enables the realization of high-speed signal changes, thereby enabling parallel comparison processes to be performed with respect to a high-speed input multiplexed signal.

The switch circuits 93-1 and 93-2 continue to open and close in synchronization with clock signals φ3 and φ4, respectively. The switch circuits 94-1 through 94-10 continue to open and close in synchronization with clock signals φs2, φs3, φs11, φs11, φs3, φs4, φs12, φs12, φs4, and φs5, respectively. The switch circuits 95-1 through 95-3 continue to open and close in synchronization with clock signals φh3 through φh5, respectively. The switch circuits 96-1 through 96-3 continue to open and close in synchronization with clock signals φr3 through φr5, respectively.

As was previously described, each of the interpolation units 97-1 through 97-3 is provided as a set of 32 identical units. Each of the 32 interpolation units 97-2, for example, has the inputs thereof connected to the switch circuits 93-1 and 93-2, and has the output thereof connected to the non-inverted input of the comparison circuit 91-2. Among the 32 interpolation units 97-2, x interpolation units 97-2 have active φs3 and inactive φs4, and the 32−x remaining interpolation units 97-2 have inactive φs3 and active φs4. As a result, the sampled voltage is the voltage obtained by interpolating, with a ratio of x/32:(32−x)/32, the respective voltages of two signals next to each other in time, among the multiplexed signals applied to the input terminal INPUT. With the use of such an interpolation process, sampling a received signal at fixed sample timing provided on the receiver side achieves the same or similar effect as sampling at the center of each data unit, despite the fact that the position of each data unit of the received signal has a fixed position relative to the sampling points. The operations of the other interpolation units are the same or similar.

Figure 23:
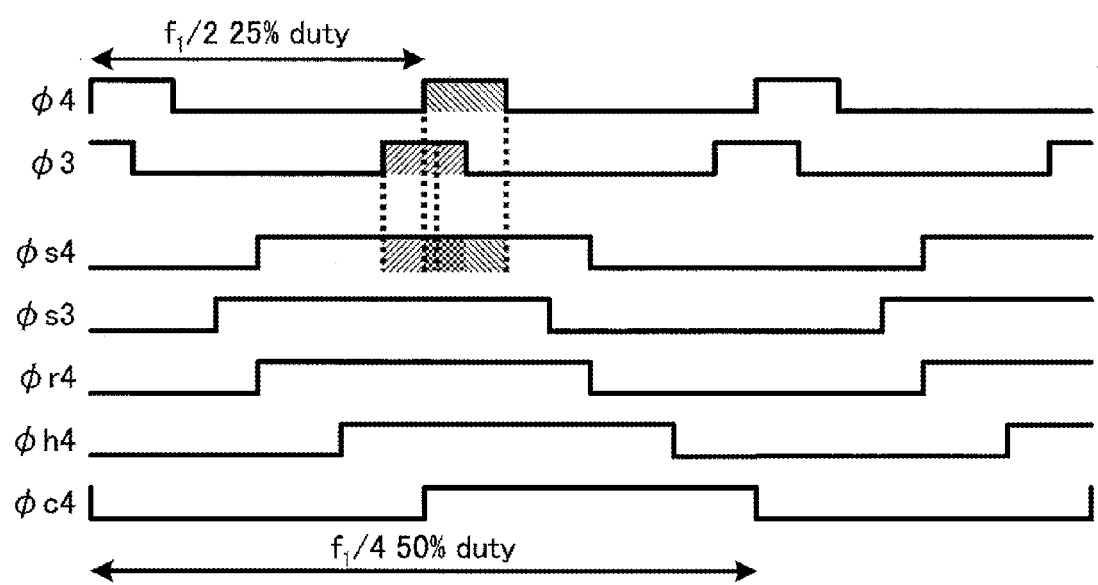
FIG. 23 is a drawing illustrating an example of the waveforms of the clock signals used in the parallel processing circuit illustrated in FIG. 22.

FIG. 23 is a drawing illustrating an example of the waveforms of the clock signals used in the parallel processing circuit illustrated in FIG. 22. FIG. 23 illustrates only the representative clock signals suitable for the purpose of explaining the operation of the parallel processing circuit illustrated in FIG. 22. As illustrated in FIG. 23, the clock signals φ3 and φ4 have predetermined frequency $f_1/2$ and a duty cycle of 25%. The clock signals φs4, φs3, φr4, φh4, and φc4 have frequency $f_1/4$ and a duty cycle of 50%. Among the switch circuits illustrated in FIG. 23, only the switch circuits 95-1 through 95-3 become conductive when the clock signal is LOW, and become nonconductive when the clock signal is HIGH. The remaining switch circuits become conductive when the clock signal is HIGH, and become nonconductive when the clock signal is LOW. The sample and hold operations performed by the capacitor devices illustrated in FIG. 22 are the same as or similar to the sample and hold operations performed by the capacitor devices illustrated in FIG. 20, and a description thereof will be omitted.

In the parallel processing circuit illustrated in FIG. 22 and FIG. 23, clock signals having predetermined frequency $f_1/2$ and a duty cycle of 25% such as φ3 and φ4 are used. Further, clock signals having frequency $f_1/4$ and a duty cycle of 50% such as φs4, φs3, φr4, φh4, and φs4 are used. Accordingly, it is desirable to generate these various clock signals having desired timing relationships therebetween.

Figure 24:
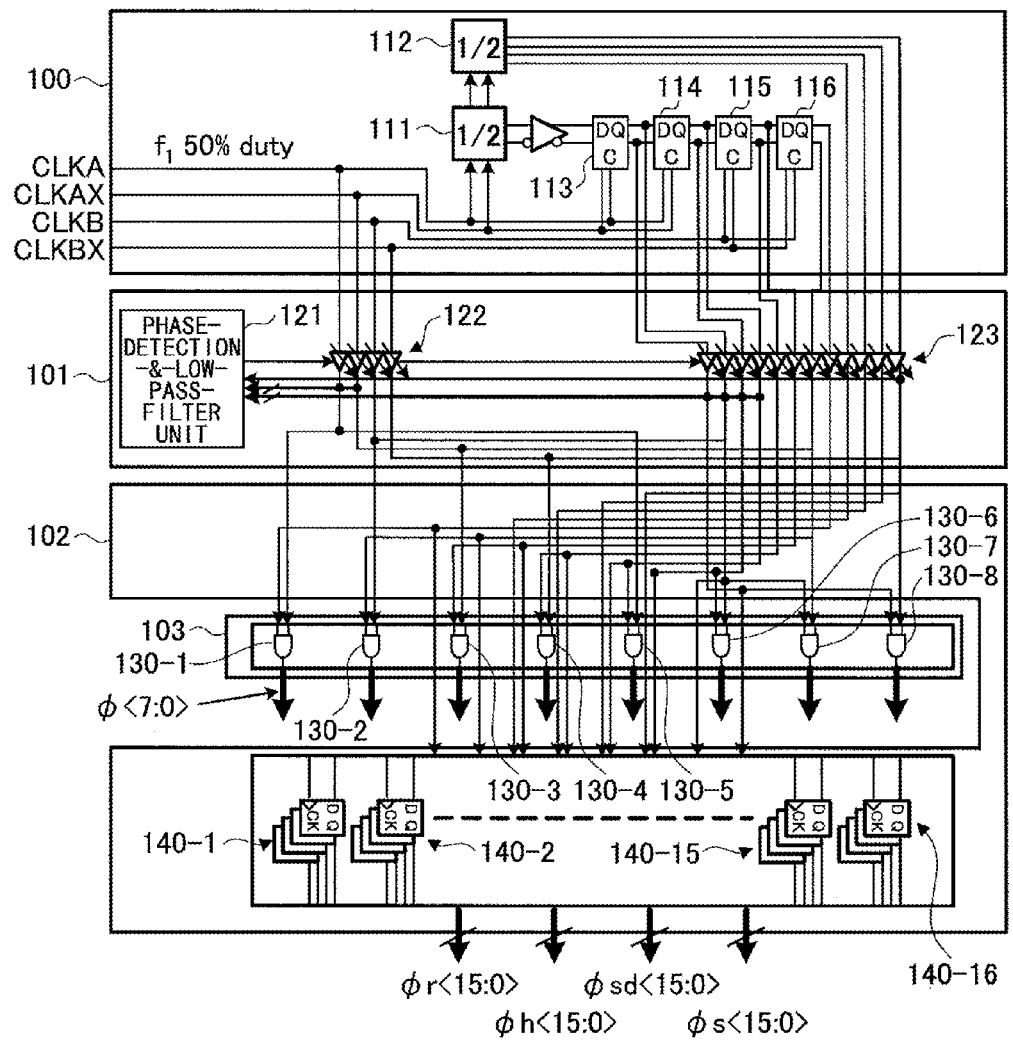
FIG. 24 is a drawing illustrating an example of the configuration of a clock generation circuit.

FIG. 24 is a drawing illustrating an example of the configuration of a clock generation circuit. The clock generation circuit illustrated in FIG. 24 is used to generate the clock signals used in the parallel processing circuit illustrated in FIG. 20 or FIG. 22. The clock generation circuit illustrated in FIG. 24 includes a frequency divider circuit 100, a timing adjustment circuit 101, a retiming circuit 102, and an AND gate unit 103.

Figure 27:
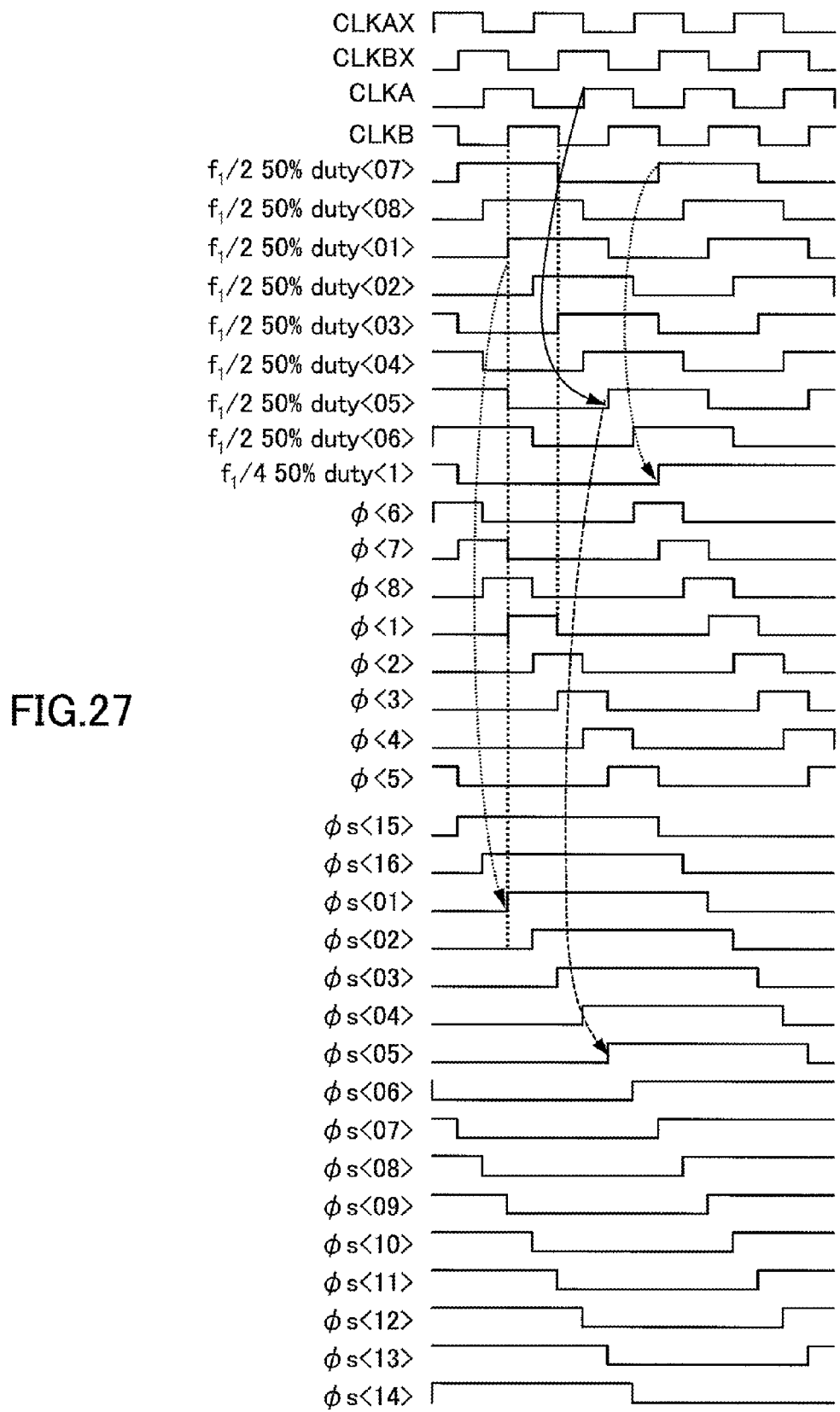
FIG. 27 is a drawing illustrating an example of signals generated by the clock generation circuit illustrated in FIG. 24.

The frequency divider circuit 100 includes a ½ frequency divider circuit 111, a ½ frequency divider circuit 112, and flip-flops 113 through 116. The frequency divider circuit 100 receives clock signals CLKA, CLKAX, CLKB, and CLKBX having frequency $f_1$ and a duty cycle of 50%. CLKA and CLKB have a phase displacement of 90 degrees relative to each other. CLKA and CLKAX are the inverse of each other (i.e., having a phase displacement of 180 degrees relative to each other). CLKB and CLKBX are the inverse of each other (i.e., having a phase displacement of 180 degrees relative to each other). The ½ frequency divider circuit 111 divides the frequency of CLKA and CLKAX by two, thereby generating clock signals having frequency $f_1/2$ and a duty cycle of 50%. The ½ frequency divider circuit 112 divides the frequency of the clock signals generated by the ½ frequency divider circuit 111 by two, thereby generating clock signals having frequency $f_1/4$ and a duty cycle of 50%. The flip-flops 113 and 114 receive CLKA and CLKAX as clock signals, and load the clock signals having frequency $f_1/2$ and a duty cycle of 50% in synchronization with the received clock signals, thereby retiming the clock signals. The flip-flops 115 and 116 receive CLKB and CLKBX as clock signals, and load the clock signals having frequency $f_1/2$ and a duty cycle of 50% in synchronization with the received clock signals, thereby retiming the clock signals. In this manner, the frequency divider circuit 100 generates and outputs four clock signals each having a phase displacement of 45 degrees relative to the most adjacent clock signal and having frequency $f_1/2$ and a duty cycle of 50%. Each clock signal is a differential signal which is composed of a pair of two clock signals, i.e., an in-phase clock signal and an inverted clock signal. In this manner, eight clock signals each having a phase displacement of 45 degrees relative to the most adjacent clock signal and having frequency $f_1/2$ and a duty cycle of 50% are obtained. These clock signals are illustrated in FIG. 27 as "$f_1/2$ 50% duty<01>" through "$f_1/2$ 50% duty<07>".

The clock signals having frequency $f_1/4$ and a duty cycle of 50% generated by the ½ frequency divider circuit 112 of the frequency divider circuit 100 may be four clock signals each having a phase displacement of 90 degrees relative to the most adjacent clock signal. One of these four clock signals is illustrated as "$f_1/4$ 50% duty<1>" in FIG. 27.

The timing adjustment circuit 101 may have the same or similar configuration as the timing adjustment circuit illustrated in FIG. 2. The timing adjustment circuit 101 includes a phase-detection-&-low-pass-filter unit 121, a delay circuit 122, and a variable-delay circuit 123. The phase-detection-&-low-pass-filter unit 121 corresponds to the phase detector 23 and the low-pass filter 24 illustrated in FIG. 2. The delay circuit 122 corresponds to the delay circuit 21 illustrated in FIG. 2. The variable-delay circuit 123 corresponds to the variable-delay circuits 22-1 through 22-3 illustrated in FIG. 2. The phase detection part of the phase-detection-&-low-pass-filter unit 121 generates a detection signal indicative of the timing relationship between clock signals in response to the signals obtained by the delay circuit 122 delaying CLKA and CLKAX and the signals obtained by the variable-delay circuit 123 delaying the clock signals having frequency $f_1/2$ and a duty cycle of 50%. Specifically, the phase detection part generates a detection signal indicative of the timing relationship between the clock signal having frequency $f_1$ and the two clock signals having frequency $f_1/2$ and a phase displacement of 90 degrees relative to each other, such as the clock signals illustrated in FIG. 3. The low-pass filter part of the phase-detection-&-low-pass-filter unit 121 performs low-pass filtering with respect to the detection signal generated by the phase detection part. In response to the output of the low-pass filter, the variable-delay circuit 123 adjusts the relative timing relationship between the clock signals such that the center point of a pulse of the clock signal having frequency $f_1/2$ is aligned with the center point of a pulse of the clock signal having frequency $f_1$, as in the relationship illustrated in FIG. 3. The variable-delay circuit 123 also delays the clock signal having frequency $f_1/4$ and a duty cycle of 50% in response to the output of the low-pass filter to impose the same delay length as the delay length imposed on the clock signal having frequency $f_1/2$ and a duty cycle of 50%. The delay circuit 122 may have a fixed delay length.

Figure 25:
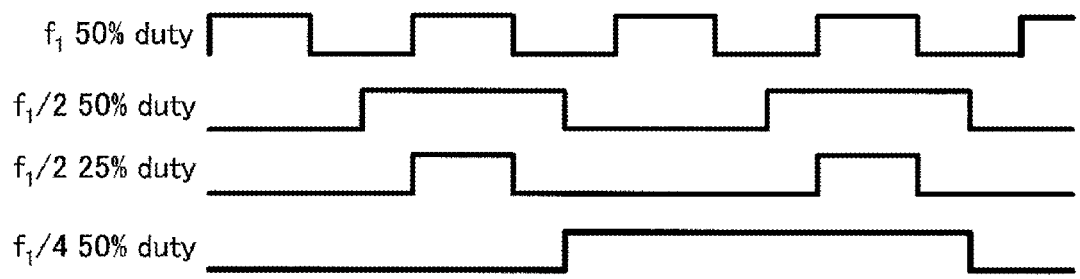
FIG. 25 is a drawing illustrating an example of signals used in the clock generation circuit illustrated in FIG. 24.

FIG. 25 is a drawing illustrating an example of signals used in the clock generation circuit illustrated in FIG. 24. The AND gate unit 103 illustrated in FIG. 24 performs an AND operation between the clock signal having frequency $f_1$ and the clock signal having frequency $f_1/2$ which are adjusted to have the center points of pulses thereof aligned with each other as in the relationship illustrated in FIG. 25. This arrangement servers to generate a clock signal having frequency $f_1/2$ and a duty cycle of 25%. Similarly, eight clock signals <7:0> are generated that have a phase displacement of 45 degrees relative to an adjacent clock signal as illustrated in FIG. 27.

The retiming circuit 102 illustrated in FIG. 24 retimes (i.e., adjusts the timing of) the clock signals having frequency $f_1/4$ and a duty cycle of 50% which are generated by the ½ frequency divider circuit 112 of the frequency divider circuit 100 and which have the delays thereof adjusted by the timing adjustment circuit 101. To be more specific, the retiming of the clock signals having frequency $f_1/4$ is achieved by establishing synchronization with the edges of the clock signals having frequency $f_1/2$ and a duty cycle of 50% which are generated by the frequency divider circuit 100 and which have the delay thereof adjusted by the timing adjustment circuit 101. For example, the clock signal having frequency $f_1/4$ and a duty cycle of 50% illustrated in FIG. 25 is loaded to a flip-flop at the rising edge of the clock signal having frequency $f_1/2$ and a duty cycle of 50%, so that the retimed signal is obtained at the output of the flip-flop.

Figure 26:
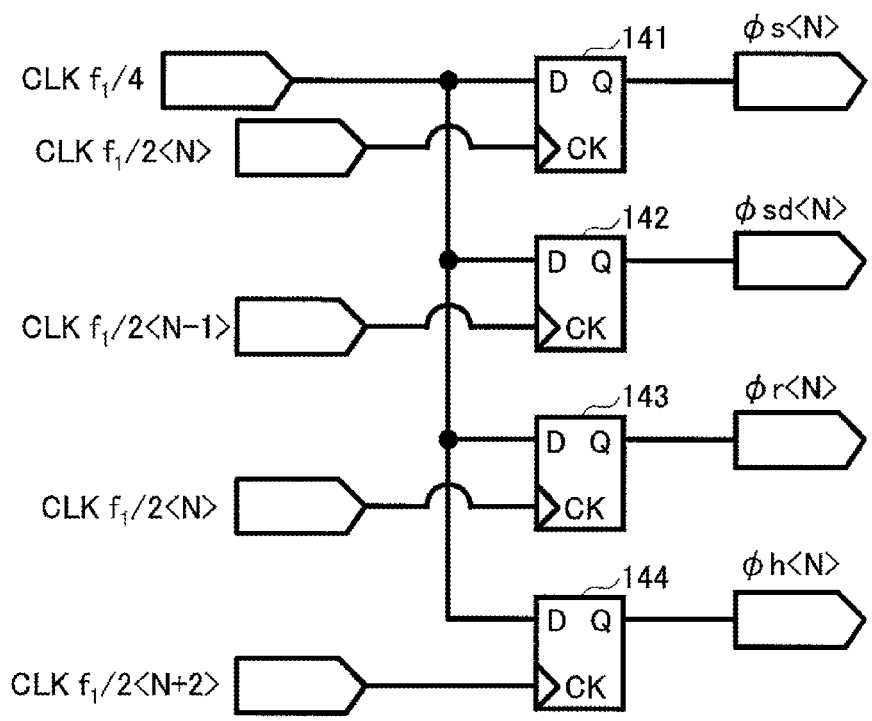
FIG. 26 is a drawing illustrating an example of the configuration of a retiming circuit used in the clock generation circuit illustrated in FIG. 24.

FIG. 26 is a drawing illustrating an example of the configuration of a retiming circuit. The retiming circuit illustrated in FIG. 26 includes flip-flops 141 through 144. Each of the flip-flops 141 through 144 receives at a clock input CK thereof a clock signal CLK having frequency $f_1/2$ and a duty cycle of 50%, and receives at a data input D thereof a clock signal CLK having frequency $f_1/4$ and a duty cycle of 50%. The clock signal CLK having frequency $f_1/2$ as designated by <N> may be "$f_1/2$ 50% duty<04>" (in the case of N being 4) illustrated in FIG. 27, for example. Retiming performed by use of the rising edges of this clock signal produces φs4 (N=4) and φr4 (N=4) at the outputs of the flip-flops 141 and 143. As illustrated in FIG. 21 and FIG. 23, φs4 and φr4 are clock signals having the same timing.

Further, the clock signal CLK having frequency $f_1/2$ as designated by <N−1> in FIG. 26 is "$f_1/2$ 50% duty<03>" (in the case of N being 4) illustrated in FIG. 27, for example. Retiming performed by use of the rising edges of this clock signal produces φsd4 (N=4) at the output of the flip-flop 142. φsd4 is the same as φs3 illustrated in FIG. 23.

Further, the clock signal CLK having frequency $f_1/2$ as designated by <N−2> in FIG. 26 is "$f_1/2$ 50% duty<06>" (in the case of N being 4) illustrated in FIG. 27, for example. Retiming performed by use of the rising edges of this clock signal produces φh4 (N=4) at the output of the flip-flop 144. As illustrated in FIG. 21 and FIG. 23, φh4 has a phase displacement of 45 degrees relative to φr4.

FIG. 27 is a drawing illustrating an example of signals generated by the clock generation circuit illustrated in FIG. 24. As illustrated in FIG. 27, the clock signals φs having frequency $f_1/2$ and a duty cycle of 50% include 16 clock signals φs<01> through φs<16> each having a phase displacement of 22.5 degrees relative to the most adjacent clock signal. Similarly, 16 clock signals φh, φr, and φsd temporally overlapping the clock signal φs are generated as was described in connection with the operations of the retiming circuit illustrated in FIG. 26. These clock signals are output from the retiming circuit 102 illustrated in FIG. 24 as φs<15:0>, φh<15:0>, φr<15:0>, and φsd<15:0>.

According to at least one embodiment, a circuit is provided that adjusts timing between clock signals having different frequencies.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A timing adjustment circuit, comprising:
  a detection unit configured to generate a detection signal in response to a first clock signal having both a duty cycle of 50% and a first frequency, a second clock signal having both a duty cycle of 50% and a second frequency that is half the first frequency, and a third clock signal having both a duty cycle of 50% and the second frequency and having a phase displacement of 90 degrees relative to the second clock signal, the detection signal being indicative of timing relationship between the first clock signal and the second and third clock signals;
  a low-pass filter configured to receive the detection signal generated by the detection unit; and
  a variable-delay circuit configured to adjust a relative timing relationship between the first clock signal and the second clock signal in response to an output of the low-pass filter such that a center point of a pulse of the first clock signal is aligned with a center point of a pulse of the second clock signal.

2. The timing adjustment circuit as claimed in claim 1, wherein the detection signal generated by the detection unit indicates a timing relationship between the first clock signal and the second clock signal and a timing relationship between the first clock signal and the third clock signal.

3. The timing adjustment circuit as claimed in claim 1, wherein an asserted period of the detection signal is equal to a period in which all of the first clock signal, the second clock signal, and the third clock signal are LOW, and a negated period of the detection signal is equal to a period in which all of the first clock signal, the second clock signal, and the third clock signal are HIGH.

4. The timing adjustment circuit as claimed in claim 3, wherein the detection unit includes:
  three series-connected PMOS transistors having gates thereof receiving the first through third clock signals;
  three series-connected NMOS transistors having gates thereof receiving the first through third clock signals; and
  an output terminal configured to output the detection signal,
  wherein the three PMOS transistors are placed between a power supply voltage and the output terminal, and the three NMOS transistors are placed between the output terminal and a ground voltage.

5. The timing adjustment circuit as claimed in claim 3, wherein the detection unit includes:
  a first logic circuit configured to receive the first through third clock signals to produce one or two first outputs;
  one or two PMOS transistors having gates thereof receiving the one or two first outputs, respectively;
  a second logic circuit configured to receive the first through third clock signals to produce one or two second outputs;
  one or two NMOS transistors having gates thereof receiving the one or two second outputs, respectively; and
  an output terminal configured to output the detection signal, wherein the one or two PMOS transistors are placed between a power supply voltage and the output terminal, and the one or two NMOS transistors are placed between the output terminal and a ground voltage.

6. The timing adjustment circuit as claimed in claim 1, wherein the variable-delay circuit is configured to adjust, by a step size of a first time length, the relative timing relationship between the first clock signal and the second clock signal in response to the output of the low-pass filter, and to adjust, by a step size of a second time length longer than the first time length, the relative timing relationship between the first clock signal and the second clock signal in response to the output of the low-pass filter.

7. A clock generation circuit, comprising:
   a frequency divider circuit configured to divide a frequency of a first clock signal having both a duty cycle of 50% and a first frequency to generate a second clock signal having both a duty cycle of 50% and a second frequency that is half the first frequency, a third clock signal having both a duty cycle of 50% and the second frequency and having a phase displacement of 90 degrees relative to the second clock signal, and a fourth clock signal having both a duty cycle of 50% and a third frequency that is one fourth of the first frequency;
   a detection unit configured to generate a detection signal in response to the first clock signal, the second clock signal, and the third clock signal, the detection signal being indicative of a timing relationship between the first clock signal and the second and third clock signals;
   a low-pass filter configured to receive the detection signal generated by the detection unit;
   a variable-delay circuit configured to adjust a relative timing relationship between the first clock signal and the second clock signal in response to an output of the low-pass filter such that a center point of a pulse of the first clock signal is aligned with a center point of a pulse of the second clock signal;
   a variable-delay circuit configured to variably control a delay time with respect to the fourth clock signal in response to the output of the low-pass filter; and
   an AND gate configured to perform an AND operation between the first clock signal and the second clock signal to generate a fifth clock signal having both a duty cycle of 25% and the second frequency.

8. The clock generation circuit as claimed in claim 7, further comprising a retiming circuit configured to synchronize the fourth clock signal with the second clock signal.

9. A method for timing adjustment, comprising:
   generating a detection signal in response to a first clock signal having both a duty cycle of 50% and a first frequency, a second clock signal having both a duty cycle of 50% and a second frequency that is half the first frequency, and a third clock signal having both a duty cycle of 50% and the second frequency and having a phase displacement of 90 degrees relative to the second clock signal, the detection signal being indicative of timing relationship between the first clock signal and the second and third clock signals;
   performing low-pass filtering with respect to the detection signal; and
   adjusting a relative timing relationship between the first clock signal and the second clock signal in response to an output of the low-pass filtering such that a center point of a pulse of the first clock signal is aligned with a center point of a pulse of the second clock signal.

* * * * *